(12) United States Patent
Morokuma et al.

(10) Patent No.: US 10,998,832 B2
(45) Date of Patent: May 4, 2021

(54) SIGNAL TRANSMISSION CIRCUIT AND POWER CONVERSION DEVICE

(71) Applicant: Mitsubishi Electric Corporation, Chiyoda-ku (JP)

(72) Inventors: Kenichi Morokuma, Chiyoda-ku (JP); Motoki Imanishi, Fukuoka (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/321,997

(22) PCT Filed: May 18, 2017

(86) PCT No.: PCT/JP2017/018668
§ 371 (c)(1),
(2) Date: Jan. 30, 2019

(87) PCT Pub. No.: WO2018/066165
PCT Pub. Date: Apr. 12, 2018

(65) Prior Publication Data
US 2019/0222107 A1    Jul. 18, 2019

(30) Foreign Application Priority Data

Oct. 5, 2016   (JP) .............................. JP2016-197094

(51) Int. Cl.
*H02M 7/06*   (2006.01)
*H02M 1/08*   (2006.01)

(52) U.S. Cl.
CPC ................ *H02M 7/06* (2013.01); *H02M 1/08* (2013.01)

(58) Field of Classification Search
CPC .. H03K 19/0175; H03K 17/691; H04L 25/02; H02M 1/08; H02M 3/335–42; H02M 7/06–7/106
See application file for complete search history.

(56) References Cited

U.S. PATENT DOCUMENTS 3,128,440 A * 4/1964 Davis ...................... G05F 1/445
                                                        323/344
5,686,854 A * 11/1997 Smith ................... H03K 17/567
                                                        327/374

(Continued)

FOREIGN PATENT DOCUMENTS

JP              59-15589 B2    4/1984

OTHER PUBLICATIONS

International Search Report dated Aug. 15, 2017 in PCT/JP2017/018668 filed May 18, 2017.

(Continued)

*Primary Examiner* — Thienvu V Tran
*Assistant Examiner* — Peter M Novak
(74) *Attorney, Agent, or Firm* — XSENSUS LLP

(57) ABSTRACT

A first circuit generates and outputs a transmission signal to a first end and a second end of a first coil in response to variation in logical value of an input first signal. A detection circuit detects a voltage signal generated at each of a first end and a second end and outputs a second signal which reflects the first signal based on a result of detection. A control circuit controls a voltage to be applied across opposing ends of each of a first diode and a second diode of a first rectifier circuit and a voltage to be applied to opposing ends of each of a third diode and a fourth diode of a second rectifier circuit.

19 Claims, 17 Drawing Sheets

(56) References Cited

U.S. PATENT DOCUMENTS

| | | | | |
|---|---|---|---|---|
| 6,630,650 B2* | 10/2003 | Bassill | ................... | H05B 6/062 |
| | | | | 219/626 |
| 9,906,163 B2* | 2/2018 | Faschang | .............. | H02M 7/537 |
| 2009/0168278 A1* | 7/2009 | Landry | ................... | H02H 9/041 |
| | | | | 361/56 |
| 2017/0093309 A1* | 3/2017 | Nishino | ................... | B25J 9/126 |

OTHER PUBLICATIONS

Office Action dated May 12, 2020 in Japanese Patent Application No. 2018-543585, 6 pages.

* cited by examiner

SIGNAL TRANSMISSION CIRCUIT AND POWER CONVERSION DEVICE

TECHNICAL FIELD

The present invention relates to a signal transmission circuit and a power conversion device and to a signal transmission circuit which transmits a signal through a transformer and a power conversion device including such a signal transmission circuit.

BACKGROUND ART

A device including a non-isolated line driver and a non-isolated line receiver, an insolated device implemented by an optical coupler, or an isolated device including a transformer has been known as a circuit device which transmits a digital signal.

For example, a signal transmission circuit which transmits a signal through a transformer described in Japanese Patent Publication No. 59-15589 (PTL 1) is configured as below.

The signal transmission circuit includes a matching impedance connected in series to a primary side of the transformer and a non-linear impedance with limit characteristics connected to a secondary side of the transformer. A limit voltage value of the non-linear impedance is set to a value smaller than a voltage generated on the secondary side when a normal transmission signal is applied to a pulse transformer. The signal transmission circuit is characterized in that the non-linear impedance has limit characteristics by a diode.

CITATION LIST

Patent Literature

PTL 1: Japanese Patent Publication No. 59-15589

SUMMARY OF INVENTION

Technical Problem

The signal transmission circuit described in PTL 1 is configured as above. Therefore, in application of the signal transmission circuit to a power conversion device, when a voltage as high as several hundred volts is applied across the primary side and the secondary side, a voltage on the secondary side fluctuates to a voltage equal to or higher than a limit voltage by the diode and exceeds an operating range of a shaping amplifier. Thus, an output signal which accurately reflects an input signal cannot be output.

Therefore, an object of the present invention is to provide a signal transmission circuit capable of outputting an external output signal which accurately reflects an external input signal and a power conversion device including such a signal transmission circuit.

Solution to Problem

A power conversion device according to the present invention includes a transformer having a first coil and a second coil, a first circuit connected to the first coil, the first circuit generating and outputting a transmission signal to a first end and a second end of the first coil in response to variation in logical value of an input first signal, and a second circuit connected to the second coil, the second circuit generating and outputting a second signal which reflects the first signal input to the first circuit. The second circuit includes a detection circuit having two input terminals connected to a first end and a second end of the second coil, respectively, the detection circuit detecting a voltage signal generated at each of the first end and the second end and outputting the second signal based on a result of detection, a first rectifier circuit configured with a first diode and a second diode connected in a forward direction and in a reverse direction, respectively, to the first end of the second coil, a second rectifier circuit configured with a third diode and a fourth diode connected in a forward direction and in a reverse direction, respectively, to the second end of the second coil, and a control circuit which controls a voltage to be applied to opposing ends of each of the first diode and the second diode of the first rectifier circuit and a voltage to be applied to opposing ends of each of the third diode and the fourth diode of the second rectifier circuit.

Advantageous Effects of Invention

According to the present invention, the control circuit controls a voltage to be applied to opposing ends of each of the first diode and the second diode of the first rectifier circuit and a voltage to be applied to opposing ends of each of the third diode and the fourth diode of the second rectifier circuit so that an external output signal which accurately reflects an external input signal can be output.

BRIEF DESCRIPTION OF DRAWINGS

FIG. 3 is a diagram showing a configuration of a signal transmission circuit 1000a.

DESCRIPTION OF EMBODIMENTS

Figure 1:
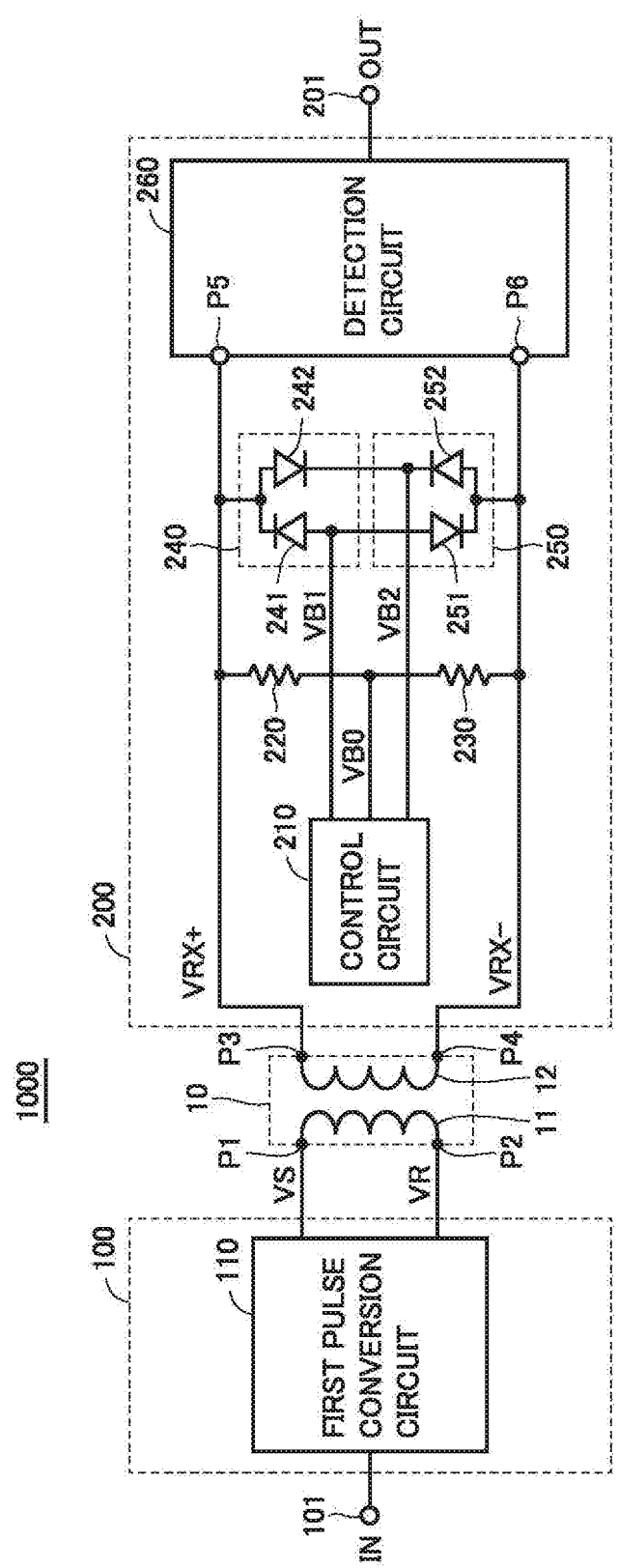
FIG. 1 is a diagram showing a circuit configuration of a signal transmission circuit 1000 according to a first embodiment.

A signal transmission circuit according to a first embodiment of this invention will be described below with reference to the drawings. Similar components in embodiments below have the same reference numerals allotted.

First Embodiment

FIG. 1 is a diagram showing a circuit configuration of a signal transmission circuit 1000 according to a first embodiment. As shown in FIG. 1, signal transmission circuit 1000 includes a transformer 10 having a first coil 11 and a second coil 12, a first circuit 100 connected to first coil 11, and a second circuit 200 connected to second coil 12.

An input signal IN (a first signal) is input from an input terminal 101 to first circuit 100. First circuit 100 transmits input signal IN to second circuit 200 through transformer 10. An output signal OUT (a second signal) is output from an output terminal 201 of second circuit 200. As a result of this signal transmission, output signal OUT accurately reflects input signal IN. Accurate reflection means that input signal IN and output signal OUT are identical to each other in outer shape in change over time but an amplitude thereof does not have to be maintained.

First circuit 100 includes a first pulse conversion circuit 110.

First pulse conversion circuit 110 generates transmission signals VS and VR in response to variation in logical value of input signal IN input from input terminal 101 and outputs the respective transmission signals to a first end P1 of first coil 11 and a second end P2 of first coil 11. When received input signal IN makes transition from a low level to a high level, first pulse conversion circuit 110 outputs transmission signal VS including a pulse having a width of a prescribed period to first end P1 of first coil 11. When input signal IN makes transition from the high level to the low level, first pulse conversion circuit 110 outputs transmission signal VR including a pulse having a width of a prescribed period to second end P2 of first coil 11. A single pulse signal or a plurality of pulse signals may be output to first end P1 and second end P2 of first coil 11, and a detection circuit 260 of second circuit 200 should only provide output signal OUT which accurately reflects input signal IN.

Second circuit 200 is connected to second coil 12 and generates and outputs a signal OUT (second signal) which reflects input signal IN (first signal) input to first circuit 100.

Second circuit 200 includes detection circuit 260, a first rectifier circuit 240, a second rectifier circuit 250, a control circuit 210, and output resistors 220 and 230 of control circuit 210.

Detection circuit 260 includes input terminals P5 and P6. Input terminal P5 is connected to a first end P3 of second coil 12. Input terminal P6 is connected to a second end P4 of second coil 12. Detection circuit 260 detects voltage signals VRX+ and VRX− generated at first end P3 of second coil 12 and second end P4 of second coil 12, respectively, and generates and provides output signal OUT based on detected VRX+ and VRX−. For example, detection circuit 260 has output signal OUT rise when a value calculated by subtracting VRX− from VRX+ is equal to or greater than a first threshold value (a positive value), and has output signal OUT fall when a value calculated by subtracting VRX− from VRX+ is equal to or smaller than a second threshold value (a negative value).

First rectifier circuit 240 is connected to first end P3 of second coil 12. First rectifier circuit 240 restricts an amount of increase and an amount of decrease in potential at first end P3 of second coil 12 produced at the time when a large potential difference is produced between first coil 11 and second coil 12 of transformer 10.

Second rectifier circuit 250 is connected to second end P4 of second coil 12. Second rectifier circuit 250 restricts an amount of increase and an amount of decrease in potential at second end P4 of second coil 12 produced at the time when a large potential difference is produced between first coil 11 and second coil 12 of transformer 10.

Control circuit 210 controls an amount of increase and an amount of decrease in potential at first end P3 of second coil 12 in first rectifier circuit 240 and controls an amount of increase and an amount of decrease in potential at second end P4 of second coil 12 in second rectifier circuit 250.

First rectifier circuit 240 includes a diode 241 connected in a forward direction toward first end P3 of second coil 12 and a diode 242 connected in a reverse direction toward first end P3 of second coil 12.

Second rectifier circuit 250 includes a diode 251 connected in a forward direction toward second end P4 of second coil 12 and a diode 252 connected in a reverse direction toward second end P4 of second coil 12.

An anode of diode 241 and an anode of diode 251 are connected to each other. A cathode of diode 242 and a cathode of diode 252 are connected to each other. Output resistor 220 of control circuit 210 has one end connected to first end P3 of second coil 12. Output resistor 230 of control circuit 210 has one end connected to second end P4 of second coil 12.

Control circuit 210 controls a control voltage VB1 to the anode of diode 241 and the anode of diode 251. Control circuit 210 controls a control voltage VB2 to the cathode of diode 242 and the cathode of diode 252. Control circuit 210 controls a bias voltage VB0 sent to the cathode of diode 241 and the anode of diode 242 through output resistor 220 of control circuit 210 and sent to the cathode of diode 251 and the anode of diode 252 through output resistor 230 of control circuit 210.

As set forth above, according to the present embodiment, an external output signal which accurately reflects an external input signal can be output by adjusting magnitude of control voltages VB1 and VB2 and bias voltage VB0.

Second Embodiment

Figure 2:
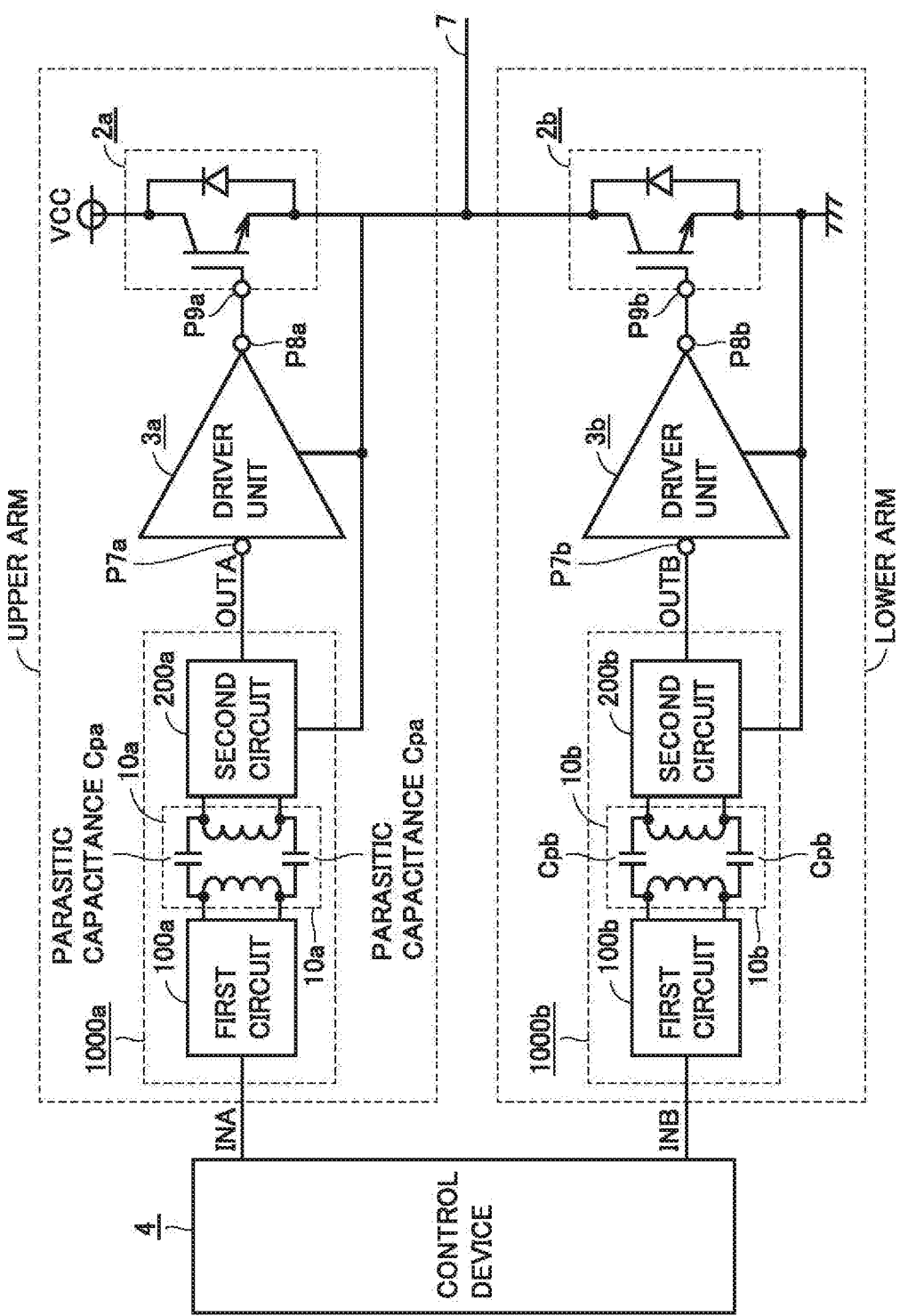
FIG. 2 is a diagram showing a power conversion device in a second embodiment.

FIG. 2 is a diagram showing a power conversion device in a second embodiment.

This power conversion device includes a control device 4, signal transmission circuits 1000a and 1000b, driver units 3a and 3b, and power semiconductor switching elements 2a and 2b.

Signal transmission circuit 1000a, driver unit 3a, and power semiconductor switching element 2a constitute an upper arm. Signal transmission circuit 1000b, driver unit 3b, and power semiconductor switching element 2b constitute a lower arm.

A reference potential of driver unit 3a and signal transmission circuit 1000a in the upper arm is connected to an alternating-current (AC) output terminal 7. A reference potential of driver unit 3b and signal transmission circuit 1000b in the lower arm is connected to the ground.

As shown in FIG. 2, first circuits 100a and 100b which are on an input side of signal transmission circuits 1000a and 1000b are connected to control device 4. Second circuits 200a and 200b which are on an output side of signal transmission circuits 1000a and 1000b are connected to input terminals P7a and P7b of driver units 3a and 3b, respectively. Output terminals P8a and P8b of driver units 3a and 3b are connected to input terminals P9a and P9b of power semiconductor switching elements 2a and 2b, respectively.

A low-voltage region where control device 4 is arranged and a high-voltage region where driver units 3a and 3b and power semiconductor switching elements 2a and 2b are arranged are electrically isolated from each other by signal transmission circuits 1000a and 1000b for prevention of an erroneous operation of control device 4 and prevention of an electric shock.

Control signals generated by control device 4 are input to driver units 3a and 3b through signal transmission circuits 1000a and 1000b and open and close power semiconductor switching elements 2a and 2b, respectively. As power semiconductor switching elements 2a and 2b are opened and closed, an AC voltage between the ground level and a voltage level (from several hundred to several thousand V) generated by a high-voltage power supply VCC is generated at AC output terminal 7 of the power conversion device in accordance with a duration of an ON state of power semiconductor switching elements 2a and 2b. Since the reference potential of driver unit 3a and signal transmission circuit 1000a in the upper arm is connected to AC output terminal 7, a high voltage is applied across first circuit 100a and second circuit 200a in signal transmission circuit 1000a each time power semiconductor switching element 2a is opened and closed.

Figure 3:
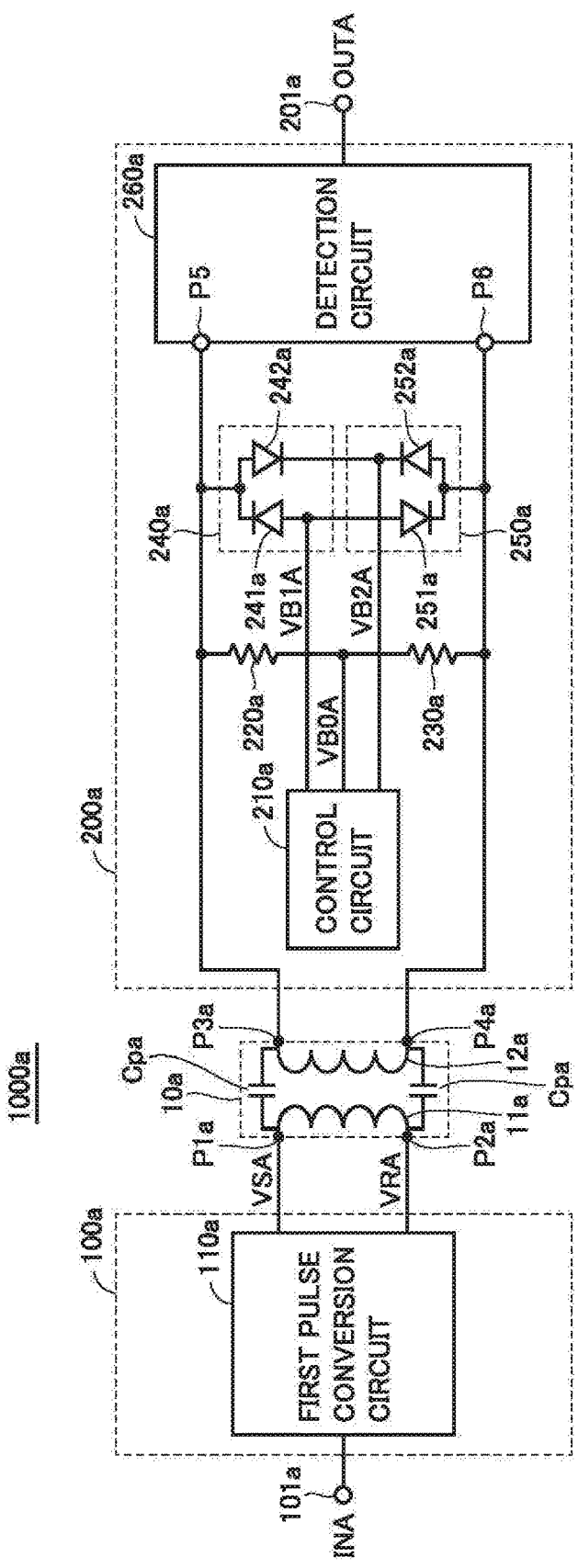

FIG. 3 is a diagram showing a configuration of signal transmission circuit 1000a.

Since signal transmission circuit 1000a is similar in configuration to signal transmission circuit 1000 in FIG. 1, description will not be repeated. Since signal transmission circuit 1000b is also the same in configuration as signal transmission circuit 1000 in FIG. 1, description will not be repeated.

Increase or decrease in potential at first end P3 and second end P4 of second coil 12 when a potential difference is produced between first coil 11 and second coil 12 of transformer 10 will now be described.

A difference between a voltage at a first end P3a of a second coil 12a of a transformer 10a of signal transmission circuit 1000a and a reference potential of a second circuit 200a (for example, a ground voltage or bias voltage VB0) at the time when power semiconductor switching element 2a is opened and closed is denoted as an amount of variation Vrc1.

Similarly, a difference between a voltage at a second end P4a of second coil 12a of transformer 10a of signal transmission circuit 1000a and a reference potential of second circuit 200a (for example, a ground voltage or bias voltage VB0) at the time when power semiconductor switching element 2a is opened and closed is denoted as an amount of variation Vrc2.

Amounts of variation Vrc1 and Vrc2 are expressed as Vrc1=dV/dt·Cpa·Z0a and Vrc2=dV/dt·Cpa·Z0a, where dV/dt represents an amount of change over time in potential V at AC output terminal 7 at the time when power semiconductor switching element 2a is opened and closed (with the reference potential of first circuit 100a of signal transmission circuit 1000a being defined as the reference), Cpa represents a parasitic capacitance between a first coil 11a and second coil 12a, and Z0a represents an input impedance of second circuit 200a.

In order to suppress amounts of variation Vrc1 and Vrc2, a current should be charged to and discharged from parasitic capacitance Cpa. A charging and discharging current ic1 necessary for parasitic capacitance Cpa is expressed as ic1=dV/dt·Cpa.

A control circuit 210a in signal transmission circuit 1000a applies control voltages VB0A, VB1A, and VB2A to a first rectifier circuit 240a and a second rectifier circuit 250a, so that a current which flows through diodes 241, 242, 251, and 252 is controlled.

Figure 4:
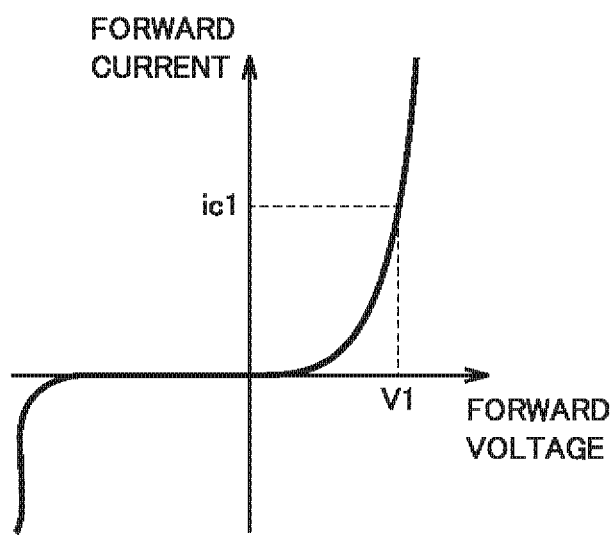
FIG. 4 is a diagram showing characteristics of a diode.

FIG. 4 is a diagram showing characteristics of a diode. A current which flows at the time when a forward voltage VD of the diode is set is denoted as i1. Forward current it of diodes 241, 242, 251, and 252 is equal to charging and discharging current ic1 necessary for parasitic capacitance Cpa between first coil 11a and second coil 12a of transformer 10a of signal transmission circuit 1000a.

Amounts of variation Vrc1 and Vrc2 produced each time power semiconductor switching element 2a is opened and closed can be controlled by output of a bias voltage VB0A, control voltage VB1A, and control voltage VB2A from control circuit 210a of signal transmission circuit 1000a to first rectifier circuit 240a and second rectifier circuit 250a.

When a voltage at first end P3a of second coil 12a of signal transmission circuit 1000a is varied in a decreasing direction in response to opening and closing of power semiconductor switching element 2a, a diode 241a of first rectifier circuit 240a of signal transmission circuit 1000a operates to suppress the amount of variation. Magnitude of a limit voltage VLn1 for amount of variation Vrc1 in voltage at first end P3a of second coil 12a is expressed as |VLn1|=VN1+(VB0A·VB1A). VN1 represents a forward voltage of diode 241a.

When magnitude of voltages VB0A and VB1A output from control circuit 210a of signal transmission circuit 1000a is set to satisfy a condition of VB0A=VB1A, limit voltage VLn1 is equal in magnitude to forward voltage VN1 of diode 241a. When magnitude of voltages VB0A and VB1A output from control circuit 210a of signal transmission circuit 1000a is set to satisfy a condition of VB0A>VB1A, limit voltage VLn1 is greater in magnitude than VN1. When magnitude of voltages VB0A and VB1A output from control circuit 210a of signal transmission circuit 1000a is set to satisfy a condition of VB0A<VB1A, limit voltage VLn1 is smaller in magnitude than VN1.

When a voltage at first end P3a of second coil 12a of signal transmission circuit 1000a is varied in an increasing direction in response to opening and closing of power semiconductor switching element 2a, a diode 242a of first rectifier circuit 240a of signal transmission circuit 1000a operates to suppress the amount of variation. Magnitude of a limit voltage VLp1 for amount of variation Vrc2 in voltage at first end P3a of second coil 12a is expressed as |VLp1|=VP1+(VB2A−VB0A). VP1 represents a forward voltage of diode 242a. A condition of VP1=VN1 is satisfied.

When magnitude of voltages VB0A and VB2A output from control circuit 210a of signal transmission circuit 1000a is set to satisfy a condition of VB0A=VB2A, limit voltage VLp1 is equal in magnitude to a forward voltage VP1 of diode 242a. When magnitude of voltages VB0A and VB2A output from control circuit 210a of signal transmission circuit 1000a is set to satisfy a condition of VB0A>VB2A, limit voltage VLp1 is smaller in magnitude than VP1. When magnitude of voltages VB0A and VB2A output from control circuit 210a of signal transmission circuit 1000a is set to satisfy a condition of VB0A<VB2A, limit voltage VLp1 is greater in magnitude than VP1.

When a voltage at second end P4a of second coil 12a of signal transmission circuit 1000a is varied in a decreasing direction in response to opening and closing of power semiconductor switching element 2a, a diode 251a of second rectifier circuit 250a of signal transmission circuit 1000a operates to suppress the amount of variation. Magnitude of a limit voltage VLn2 for amount of variation Vrc2 in voltage at second end P4a of second coil 12a is expressed as |VLn2|=VN2+(VB0A−VB1A). VN2 represents a forward voltage of diode 251a. A condition of VN2=VP1=VN1 is satisfied.

When magnitude of voltages VB0A and VB1A output from control circuit 210a of signal transmission circuit 1000a is set to satisfy a condition of VB0A=VB1A, a limit voltage VLn2 is equal in magnitude to a forward voltage VN2 of diode 251a. When magnitude of voltages VB0A and VB1A output from control circuit 210a of signal transmission circuit 1000a is set to satisfy a condition of VB0A>VB1A, limit voltage VLn2 is greater in magnitude than VN2. When magnitude of voltages VB0A and VB1A output from control circuit 210a of signal transmission circuit 1000a is set to satisfy a condition of VB0A<VB1A, limit voltage VLn2 is smaller in magnitude than VN2.

When a voltage at second end P4a of second coil 12a of signal transmission circuit 1000a is varied in an increasing direction in response to opening and closing of power semiconductor switching element 2a, a diode 252a of s second rectifier circuit [[240a]]250a of signal transmission circuit 1000a operates to suppress the amount of variation. Magnitude of a limit voltage VLp2 for amount of variation Vrc2 in voltage at second end P4a of second coil 12a is expressed as |VLp2|=VP2+(VB2A−VB0A). VP2 represents a forward voltage of diode 252a. A condition of VP2=VP1=VN2=VN1 is satisfied.

When magnitude of voltages VB0A and VB2A output from control circuit 210a of signal transmission circuit 1000a is set to satisfy a condition of VB0A=VB2A, a limit voltage VLp2 is equal in magnitude to a forward voltage VP2 of diode 252a.

When magnitude of voltages VB0A and VB2A output from control circuit 210a of signal transmission circuit 1000a is set to satisfy a condition of VB0A>VB2A, limit voltage VLp2 is smaller in magnitude than VP2. When magnitude of voltages VB0A and VB2A output from control circuit 210a of signal transmission circuit 1000a is set to satisfy a condition of VB0A<VB2A, limit voltage VLp2 is greater in magnitude than VP2.

Figure 5:
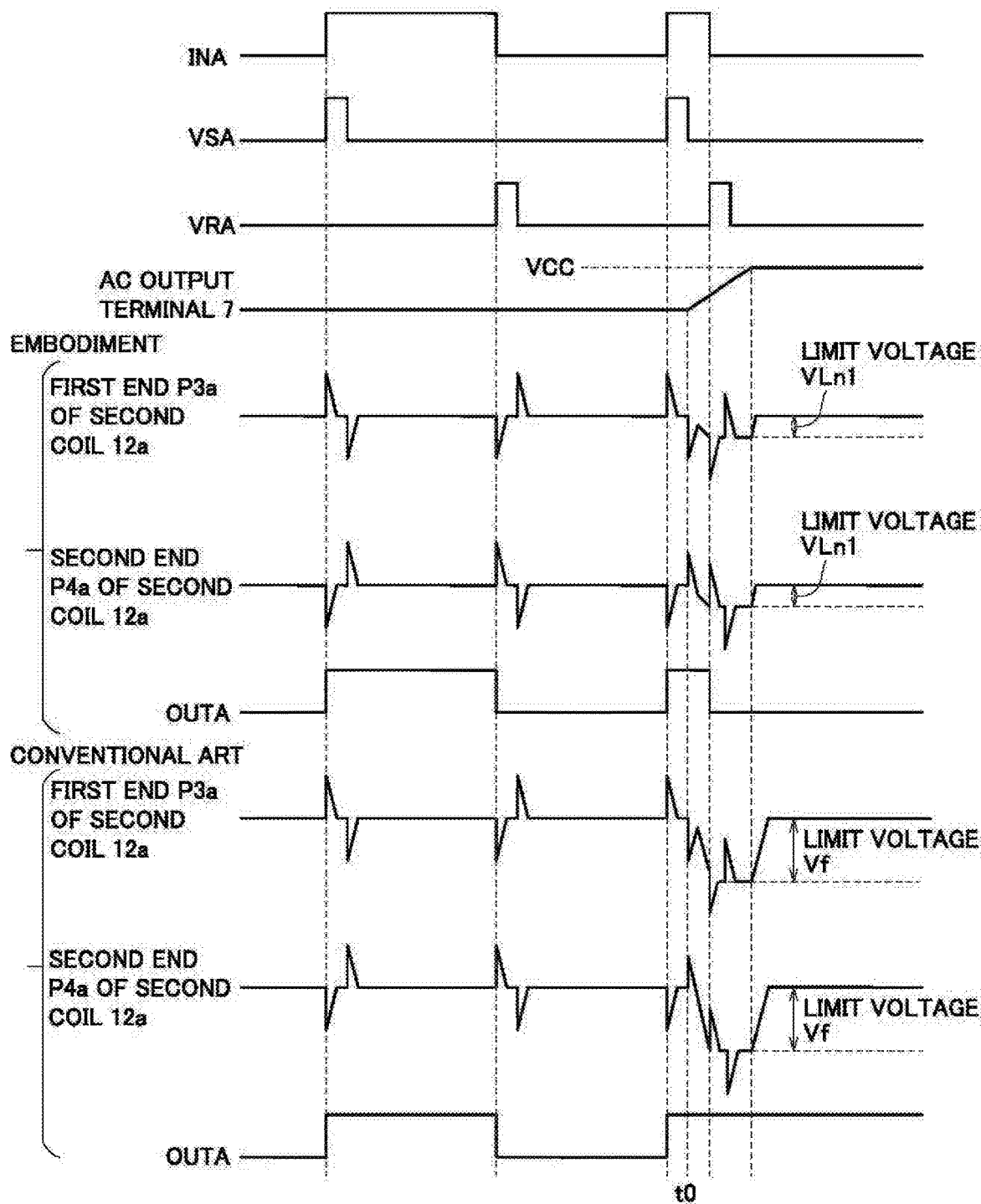
FIG. 5 is a diagram showing an operation example of the power conversion device in FIG. 2.

FIG. 5 is a diagram showing an operation example of the power conversion device in FIG. 2.

FIG. 5 shows an operation of signal transmission circuit 1000a in the upper arm when an AC voltage between the ground level and a level of a voltage generated by high-voltage power supply VCC is generated at AC output terminal 7 of the power conversion device.

An input signal INA to signal transmission circuit 1000a in the upper arm, transmission signals VSA and VRA output from first pulse conversion circuit 110, and a signal from AC output terminal 7 of the power conversion device are shown.

An output signal OUTA from signal transmission circuit 1000a in the present embodiment, a signal at first end P3a of second coil 12a of signal transmission circuit 1000a, and a signal at second end P4a of second coil 12a of signal transmission circuit 1000a are further shown.

For a reference purpose, output signal OUTA from signal transmission circuit 1000a, a signal at first end P3a of second coil 12a of signal transmission circuit 1000a, and a signal at second end P4a of second coil 12a of signal transmission circuit 1000a in the conventional art are shown.

When AC output terminal 7 is varied from the ground level to high-voltage power supply VCC at time t0 or later, signals at first end P3a and second end P4a of second coil 12a of signal transmission circuit 1000a are varied in a decreasing direction.

The signals at first end P3a and second end P4a of second coil 12a in the conventional art are suppressed at a limit voltage Vf. Magnitude of limit voltage Vf is not controlled. Therefore, depending on magnitude of AC output terminal 7, limit voltage Vf increases and detection circuit 260a is unable to detect signals at first end P3a and second end P4a of second coil 12a. Therefore, output signal OUTA reflecting input signal INA is not generated. In FIG. 5, output signal OUTA continues to maintain the high level at time t0 or later, and it is not varied at the timing of variation in input signal INA.

In signal transmission circuit 1000a in the present embodiment, when AC output terminal 7 is varied from the ground level to high-voltage power supply VCC at time to, first rectifier circuit 240a and second rectifier circuit 250a operate and signals at first end P3a and second end P4a of second coil 12a are limited by limit voltages VLn1 and VLn2 lower than Vf based on voltage setting in control circuit 210a. Therefore, detection circuit 260a is able to detect signals at first end P3a and second end P4a of second coil 12a. Therefore, output signal OUTA reflecting input signal INA is generated. In FIG. 5, output signal OUTA is varied at the timing of variation in input signal INA at time t0 or later.

As set forth above, according to the present embodiment, an amount of variation in voltages at first end P3a and second end P4a of second coil 12a of transformer 10a produced at the time of application of a high voltage across first circuit 100a and second circuit 200a each time power semiconductor switching element 2a is opened and closed can be controlled by using first rectifier circuit 240a, second rectifier circuit 250a, and voltages VB0A, VB1A, and VB2A applied by control circuit 210a. Signal transmission circuit 100a in the present embodiment can thus provide output signal OUTA which accurately reflects input signal INA.

Third Embodiment

Figure 6:
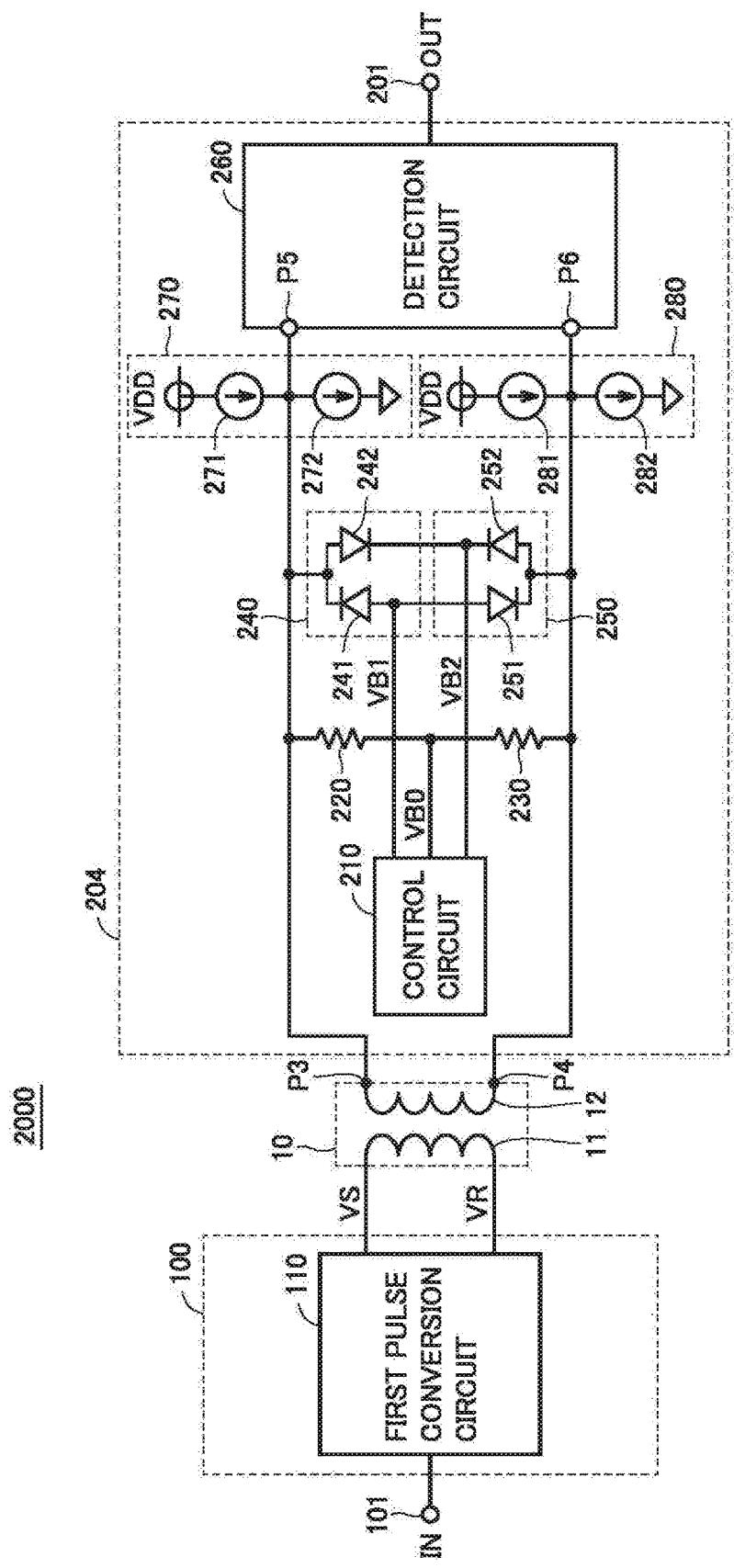
FIG. 6 is a diagram showing a circuit configuration of a signal transmission circuit 2000 according to a third embodiment.

FIG. 6 is a diagram showing a circuit configuration of a signal transmission circuit 2000 according to a third embodiment.

A second circuit 204 in signal transmission circuit 2000 in the third embodiment is different in configuration from second circuit 200 in the first embodiment.

Second circuit 204 includes a first constant current circuit 270 and a second constant current circuit 280 in addition to components included in second circuit 200 in the first embodiment.

First constant current circuit 270 is connected to first end P3 of second coil 12. First constant current circuit 270 includes a constant current source 271 and a constant current source 272. Constant current source 271 is connected to a power supply VDD and first end P3 of second coil 12.

Constant current source 272 is connected to first end P3 of second coil 12 and a reference potential (a ground potential).

Second constant current circuit 280 is connected to second end P4 of second coil 12. Second constant current circuit 280 includes a constant current source 281 and a constant current source 282. Constant current source 281 is connected to a power supply VDD and second end P4 of second coil 12. Constant current source 282 is connected to second end P4 of second coil 12 and a reference potential (ground potential).

An amount of variation in voltage at first end P3 and an amount of variation in voltage at second end P4 of second coil 12 of transformer 10 produced at the time of application of a high voltage across first circuit 100 and second circuit 204 each time power semiconductor switching element 2 is opened and closed in application of signal transmission circuit 2000 to the power conversion device are controlled by using first rectifier circuit 240, second rectifier circuit 250, and voltages VB0, VB1, and VB2 applied by control circuit 210. Thereafter, first constant current circuit 270 and second constant current circuit 280 can shorten a time period until voltages at first end P3 and second end P4 of second coil 12 return to a steady state.

Potentials at first end P3 and second end P4 of second coil 12 are varied by opening and closing of power semiconductor switching element 2 in application to the power conversion device. An amount of variation is controlled by using first rectifier circuit 240 and voltages VB0, VB1, and VB2 applied by control circuit 210. Thereafter, in the absence of first constant current circuit 270, voltages at first end P3 and second end P4 of second coil 12 return to steady voltages as a result of natural discharging or charging of diode 241, diode 242, and diodes 251 and 252. A time period τ1 until first end P3 returns to a steady voltage is determined by Cpd1 for a parasitic amount of diode 241, a parasitic capacitance Cpd2 of diode 242, and output resistor 220 (a resistance value Ra) of control circuit 210, and a condition of τ1=Ra(Cpd1+Cpd2) is satisfied. A time period τ2 until second end P4 returns to a steady voltage is determined by Cpd1 for a parasitic amount of diode 251, parasitic capacitance Cpd2 of diode 252, and output resistor 230 (resistance value Ra) of control circuit 210, and a condition of τ2=Ra(Cpd1+Cpd2) is satisfied.

In signal transmission circuit 2000, a potential at first end P3 of second coil 12 increases in response to opening and closing of power semiconductor switching element 2 in application to the power conversion device, and an amount of variation thereof is suppressed by diode 242 of first rectifier circuit 240. Thereafter, as constant current source 272 of first constant current circuit 270 pulls a current to the reference potential, a time period until the voltage at first end P3 of second coil 12 returns to the steady state can be shortened.

In signal transmission circuit 2000, a potential at second end P4 of second coil 12 increases in response to opening and closing of power semiconductor switching element 2 in application to the power conversion device, and an amount of variation thereof is suppressed by diode 252 of second rectifier circuit 250. Thereafter, as constant current source 282 of second constant current circuit 280 pulls a current to the reference potential, a time period until the voltage at second end P4 of second coil 12 returns to the steady state can be shortened.

A potential at first end P3 of second coil 12 decreases in response to opening and closing of the power semiconductor switching element in application of signal transmission circuit 2000 to the power conversion device, and an amount of variation thereof is suppressed by diode 241 of first rectifier circuit 240. Thereafter, as constant current source 271 of first constant current circuit 270 provides a current to first end P3 of second coil 12 from power supply VDD, a time period until the voltage at first end P3 of second coil 12 returns to the steady state can be shortened.

A potential at second end P4 of second coil 12 decreases in response to opening and closing of the power semiconductor switching element in application of signal transmission circuit 2000 to the power conversion device, and an amount of variation thereof is suppressed by diode 251 of second rectifier circuit 250. Thereafter, as constant current source 281 of second constant current circuit 280 provides a current to second end P4 of second coil 12 from power supply VDD, a time period until the voltage at second end P4 of second coil 12 returns to the steady state can be shortened.

As set forth above, according to the present embodiment, when a voltage at first end P3 and a voltage at second end P4 of second coil 12 are varied, a time period until the voltage at first end P3 and the voltage at second end P4 of second coil 12 return to the steady state can be shortened.

Fourth Embodiment

Figure 7:
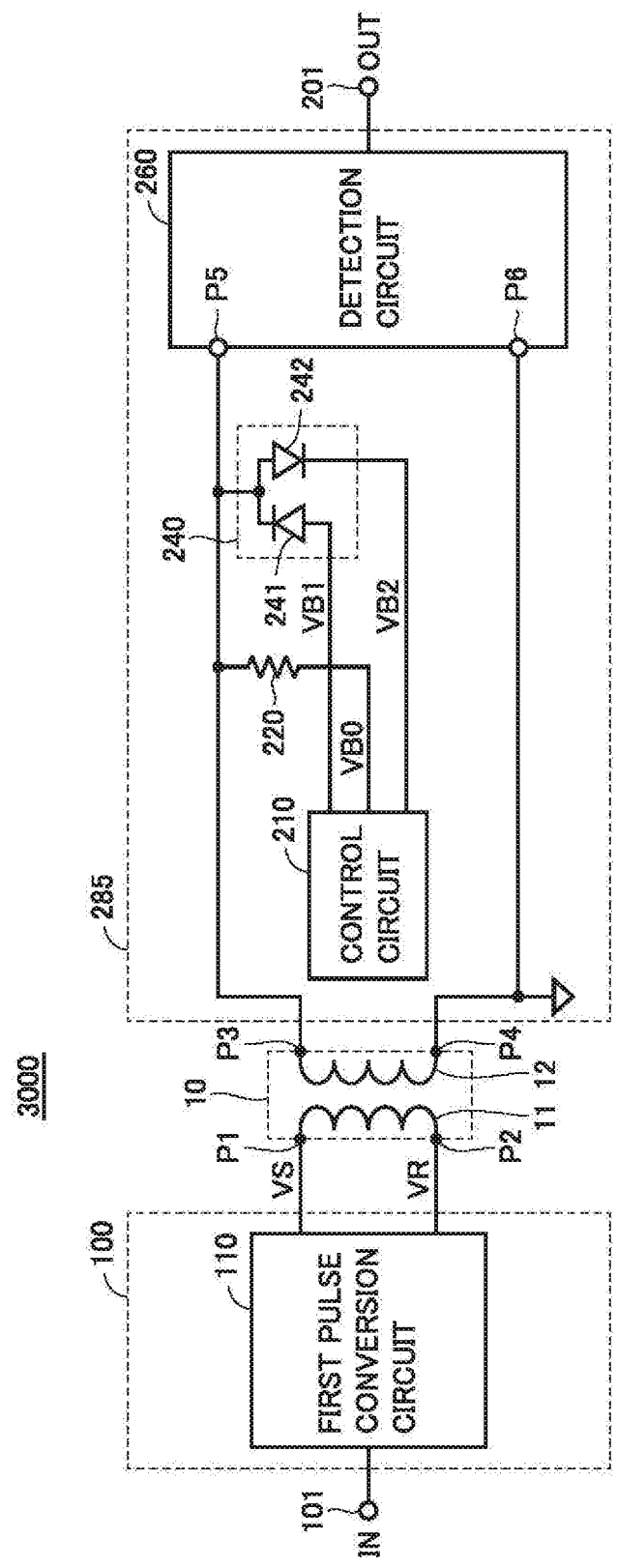
FIG. 7 is a diagram showing a circuit configuration of a signal transmission circuit 3000 according to a fourth embodiment.

FIG. 7 is a diagram showing a circuit configuration of a signal transmission circuit 3000 according to a fourth embodiment.

Signal transmission circuit 3000 in FIG. 7 represents one example of a signal transmission circuit which is a partial modification of the first embodiment and it is not limited.

As shown in FIG. 7, a second circuit 285 of signal transmission circuit 3000 does not include second rectifier circuit 250 and resistor 230 included in signal transmission circuit 1000 in the first embodiment.

Second coil 12 of transformer 10 has second end P4 connected to the reference potential (ground potential).

In the present embodiment, second rectifier circuit 250 is not provided so that a scale of a circuit can be made smaller. In the first embodiment, detection circuit 260 detects signals at both of the first end and the second end of second coil 12, so that a signal which more accurately reflects an input signal can be generated.

A function of detection circuit 260 in second circuit 285 to detect a signal generated by first circuit 100 and to provide output signal OUT which reflects input signal IN is the same as in signal transmission circuit 1000 in the first embodiment and signal transmission circuit 2000 in the second embodiment.

Fifth Embodiment

Figure 8:
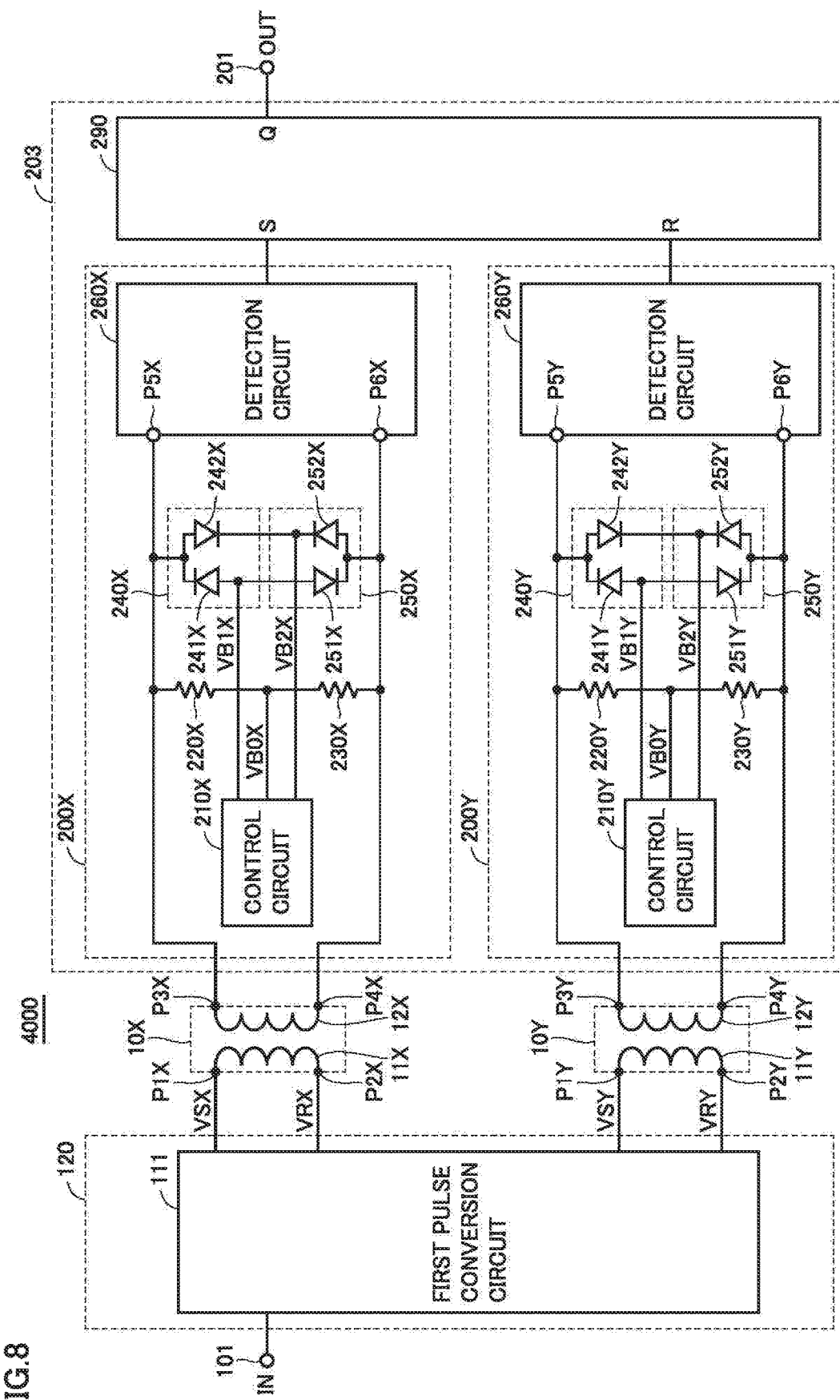
FIG. 8 is a diagram showing a circuit configuration of a signal transmission circuit 4000 according to a fifth embodiment.

FIG. 8 is a diagram showing a circuit configuration of a signal transmission circuit 4000 according to a fifth embodiment.

Signal transmission circuit 4000 includes a first circuit 120, a transformer 10X, a transformer 10Y, and a second circuit 203.

Input signal IN is input from input terminal 101 to first circuit 120. First circuit 120 transmits input signal IN to second circuit 203 through transformer 10X and transformer 10Y. Output signal OUT is output from output terminal 201 of second circuit 203. As a result of this signal transmission, output signal OUT reflects input signal IN.

Transformer 10X includes a first coil 11X and a second coil 12X. Transformer 10Y includes a third coil 11Y and a fourth coil 12Y.

First circuit 120 is connected to first coil 11X and third coil 11Y. Second circuit 203 is connected to second coil 12X and fourth coil 12Y.

First circuit 120 includes first pulse conversion circuit 111.

First pulse conversion circuit 111 generates transmission signals VSX and VRX which are set signals in response to rise of input signal IN input from input terminal 101 and outputs the respective transmission signals to a first end P1X and a second end P2X of first coil 11X. First pulse conversion circuit 111 generates transmission signals VSY and VRY which are reset signals in response to fall of input signal IN input from input terminal 101 and outputs the respective transmission signals to a first end P1Y and a second end P2Y of third coil 11Y.

When input signal IN rises from the low level to the high level, first pulse conversion circuit 111 sets transmission signal VSX to the high level only for a prescribed period. The signal set to the high level during that period serves as a set pulse signal. When input signal IN falls from the high level to the low level, first pulse conversion circuit 111 sets transmission signal VSY to the high level only for a prescribed period. The signal set to the high level during that period serves as a reset pulse signal. A single set pulse signal or a plurality of set pulse signals and a single reset pulse signal or a plurality of reset pulse signals may be issued.

Second circuit 203 is connected to second coil 12X and fourth coil 12Y and generates and outputs a second signal reflecting the first signal input to first circuit 120.

Second circuit 203 includes a circuit 200X configured similarly to second circuits 200, 200a, 204, and 285 described previously, a circuit 200Y configured similarly to second circuits 200, 200a, 204, and 285 described previously, and a latch circuit 290.

A rectifier circuit 240X is configured with a diode 241X and a diode 242X connected in a forward direction and in a reverse direction, respectively, to a first end P3X of second coil 12X. A rectifier circuit 250X is configured with a diode 251X and a diode 252X connected in a forward direction and in a reverse direction, respectively, to a second end P4X of second coil 12X. A rectifier circuit 240Y is configured with a diode 241Y and a diode 242Y connected in a forward direction and in a reverse direction, respectively, to a first end P3Y of fourth coil 12Y. A rectifier circuit 250Y is configured with a diode 251Y and a diode 252Y connected in a forward direction and in a reverse direction, respectively, to a second end P4Y of fourth coil 12Y.

An output resistor 220X of a control circuit 210X has one end connected to first end P3X of second coil 12X. An output resistor 230X of control circuit 210X has one end connected to second end P4X of second coil 12X.

An output resistor 220Y of a control circuit 210Y has one end connected to first end P3Y of fourth coil 12Y. An output resistor 230Y of control circuit 210Y has one end connected to second end P4Y of fourth coil 12Y.

Control circuit 210X controls a voltage to be applied to opposing ends of each of diode 241X and diode 242X and a voltage to be applied to opposing ends of each of diode 251X and diode 252X. Control circuit 210Y controls a voltage to be applied to opposing ends of each of diode 241Y and diode 242Y and a voltage to be applied to opposing ends of each of diode 251Y and diode 252Y.

Rectifier circuits 240X, 250X, 240Y, and 250Y, output resistors 220X, 230X, 220Y, and 230Y, and control circuits 210X and 210Y operate similarly to those in second circuits 200, 200a, 204, and 285 described previously.

A detection circuit 260X has two input terminals P5X and P6X connected to first end P3X and second end P4X of second coil 12X, respectively, detects a voltage signal generated at each of first end P3X and second end P4X, and outputs a set signal based on a result of detection. For example, detection circuit 260X has a set signal rise only for a certain period of time when a value calculated by subtracting a voltage at second end P4X from a voltage at first end P3X is equal to or greater than a third threshold value (a positive value).

A detection circuit 260Y has two input terminals P5Y and P6Y connected to first end P3Y and second end P4Y of fourth coil 12Y, respectively, detects a voltage signal generated at each of first end P3Y and second end P4Y, and outputs a reset signal based on a result of detection. For example, detection circuit 260Y has a reset signal rise only for a certain period of time when a value calculated by subtracting a voltage at second end P4Y from a voltage at first end P3Y is equal to or greater than a fourth threshold value (a positive value).

Latch circuit 290 includes a set terminal (S) which receives a set signal from detection circuit 260X and a reset terminal (R) which receives a reset signal from detection circuit 260Y. Latch circuit 290 outputs a second signal OUT which reflects a first signal (IN) input to first circuit 120.

Figure 9:
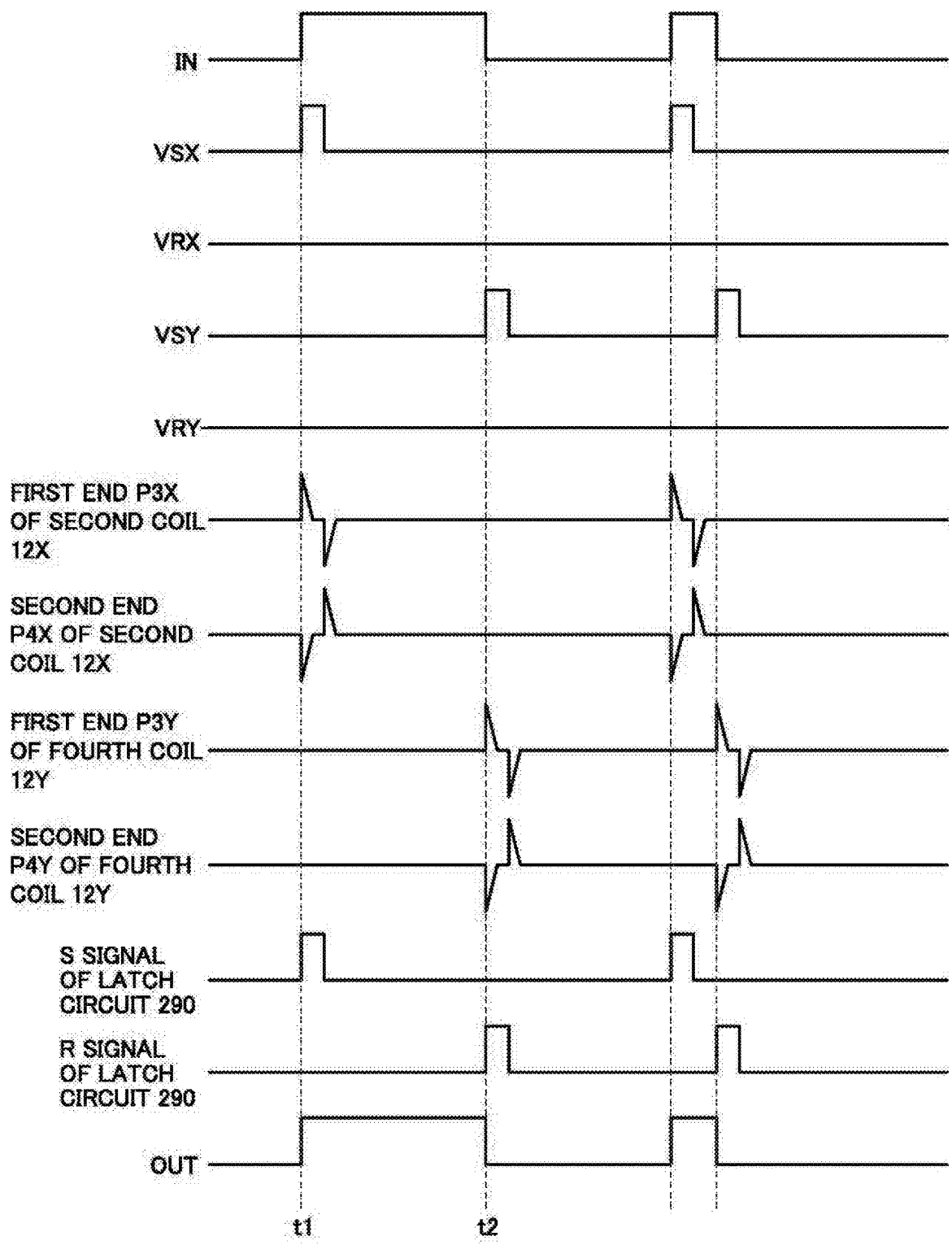
FIG. 9 is a diagram showing an operation example of a power conversion device in the fifth embodiment.

FIG. 9 is a diagram showing an operation example of a power conversion device in the fifth embodiment.

Input signal IN to signal transmission circuit 4000 and transmission signals VSX, VRX, VSY, and VRY output from first pulse conversion circuit 111 are shown.

A signal at first end P3X and a signal at second end P4X of second coil 12X and a signal at first end P3Y and a signal at second end P4Y of fourth coil 12Y in signal transmission circuit 4000 are further shown.

A set signal (an S signal) and a reset signal (an R signal) which are input signals to latch circuit 290 are shown.

When input signal IN makes transition from the low level to the high level at time t1, first pulse conversion circuit 111 sets transmission signal VSX to first coil 11X to the high level only for a certain period.

Detection circuit 260X detects signals at first end P3X and second end P4X of second coil 12X. Since a value calculated by subtracting a voltage at second end P4X from a voltage at first end P3X is equal to or greater than the third threshold value (positive value), the detection circuit has the set signal (S) rise only for a certain period of time. Consequently, the set signal (S) input to the set terminal (S) of latch circuit 290 is set to the high level. Therefore, output signal OUT makes transition from the low level to the high level and maintains the high level.

When input signal IN makes transition from the high level to the low level at time t2, first pulse conversion circuit 111 sets transmission signal VSY to third coil 11Y to the high level only for a certain period.

Detection circuit 260Y detects signals at first end P3Y and second end P4Y of fourth coil 12Y. Since a value calculated by subtracting a voltage at second end P4Y from a voltage at first end P3Y is equal to or greater than the fourth threshold value (positive value), the detection circuit has the reset signal (R) rise only for a certain period of time. Consequently, the reset signal (R) input to the reset terminal (R) of latch circuit 290 is set to the high level. Therefore, output signal OUT makes transition from the high level to the low level and maintains the low level.

As set forth above, according to the present embodiment, an output signal which more accurately reflects an input signal can be generated by using the first circuit which outputs a signal for set and a signal for reset, two transformers, two second circuits according to the first embodiment, and the latch circuit.

Sixth Embodiment

Figure 10:
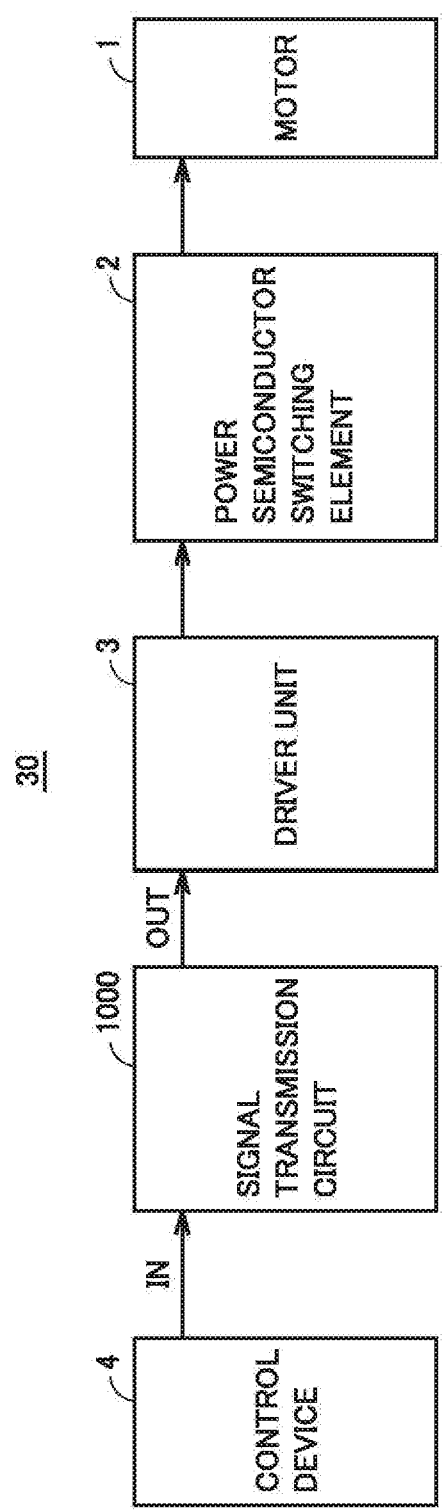
FIG. 10 is a diagram showing a configuration of a power conversion device 30 according to a sixth embodiment.

FIG. 10 is a diagram showing a configuration of a power conversion device 30 according to a sixth embodiment.

Power conversion device 30 controls a motor 1 included in a hybrid vehicle or an electric vehicle.

Power conversion device 30 includes at least one power semiconductor switching element 2, a driver unit 3, a control device 4 which generates a control signal for controlling power semiconductor switching element 2, and signal transmission circuit 1000 according to the first embodiment which transmits a control signal from control device 4 to driver unit 3. Instead of signal transmission circuit 1000 according to the first embodiment, signal transmission circuits 2000 to 4000 according to the second to fifth embodiments may be employed.

Signal transmission circuit 1000 is connected between control device 4 and driver unit 3. Signal transmission circuit 1000 isolates a device controlled at a high voltage such as driver unit 3, power semiconductor switching element 2, and motor 1 from control device 4. Signal transmission circuit 1000 receives a control signal from control device 4 as input signal IN and outputs the input signal as output signal OUT.

In this embodiment, even when a large potential difference at the time when power semiconductor switching element 2 is driven is produced between control device 4 and isolated driver unit 3 in power conversion device 30, control signal IN which is the first signal from control device 4 can accurately be reflected and output as the second signal to driver unit 3. Thus, power conversion device 30 highly reliable in transmission of control signal IN can be provided.

First Modification of Sixth Embodiment

Figure 11:
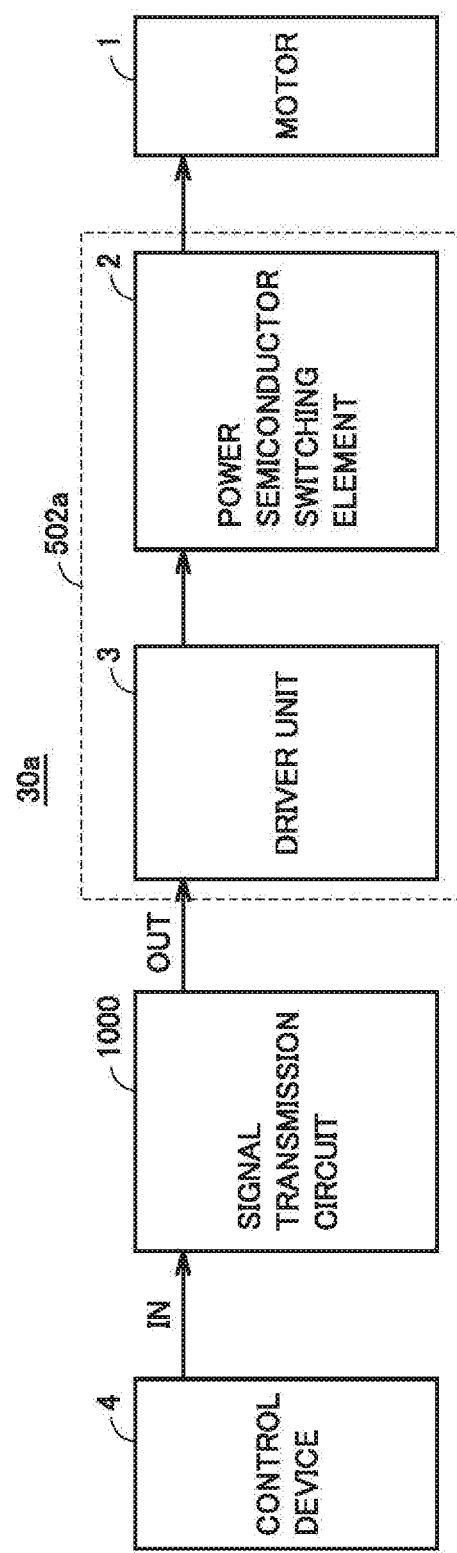
FIG. 11 is a diagram showing a configuration of a power conversion device 30a in a first modification of the sixth embodiment.

FIG. 11 is a diagram showing a configuration of a power conversion device 30a in a first modification of the sixth embodiment.

As shown in FIG. 11, power conversion device 30a is configured as in the sixth embodiment, however, power semiconductor switching element 2 and driver unit 3 are sealed and integrally formed to implement a power module 502a as one unit.

In the present modification, an effect the same as in the sixth embodiment is obtained and isolation of power semiconductor switching element 2 and driver unit 3 can be enhanced.

Second Modification of Sixth Embodiment

Figure 12:
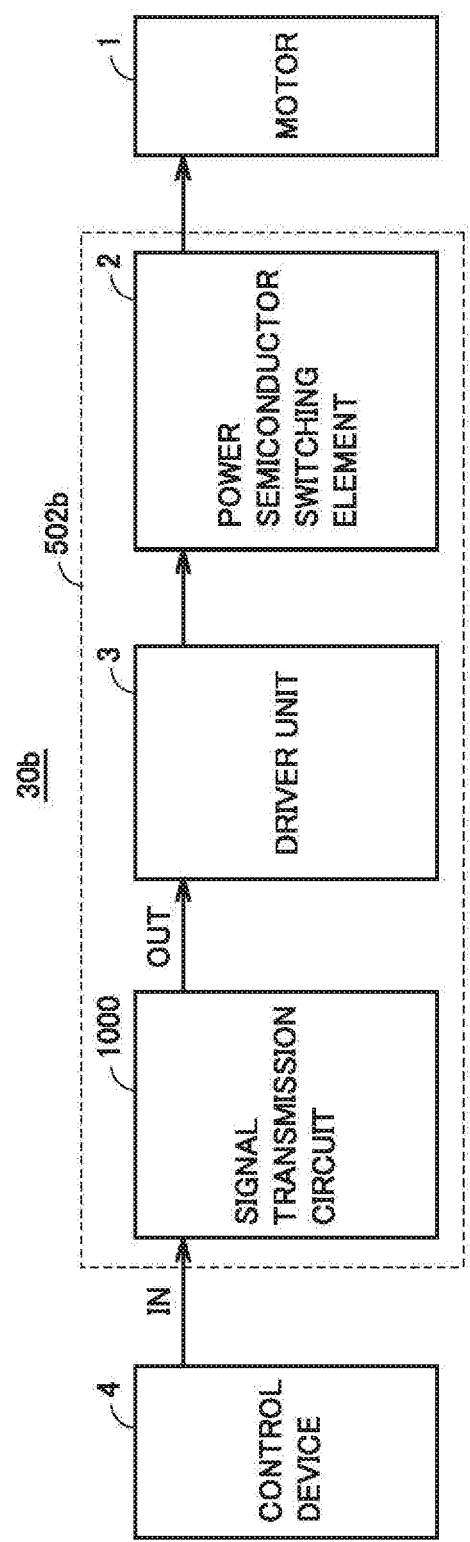
FIG. 12 is a diagram showing a configuration of a power conversion device 30b in a second modification of the sixth embodiment.

FIG. 12 is a diagram showing a configuration of a power conversion device 30b in a second modification of the sixth embodiment.

As shown in FIG. 12, power conversion device 30b is configured as in the sixth embodiment, however, power semiconductor switching element 2, driver unit 3, and signal transmission circuit 1000 are sealed and integrally formed to implement a power module 502b as one unit.

In the present modification, an effect the same as in the sixth embodiment is obtained and isolation of power semiconductor switching element 2, driver unit 3, and signal transmission circuit 1000 can be enhanced.

Third Modification of Sixth Embodiment

Figure 13:
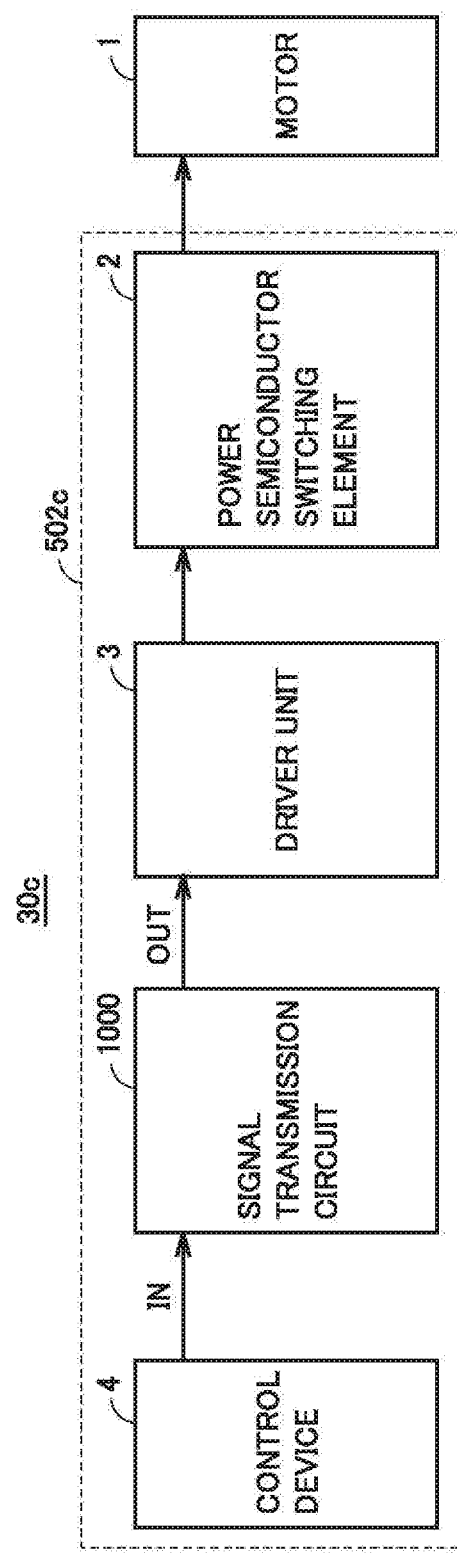
FIG. 13 is a diagram showing a configuration of a power conversion device 30c in a third modification of the sixth embodiment.

FIG. 13 is a diagram showing a configuration of a power conversion device 30c in a third modification of the sixth embodiment.

As shown in FIG. 13, power conversion device 30c is configured as in the sixth embodiment, however, power semiconductor switching element 2, driver unit 3, control device 4, and signal transmission circuit 1000 are sealed and integrally formed to implement a power module 502c as one unit.

In the present modification, an effect the same as in the sixth embodiment is obtained and isolation of power semiconductor switching element 2, driver unit 3, signal transmission circuit 1000, and control device 4 can be enhanced.

Seventh Embodiment

Figure 14:
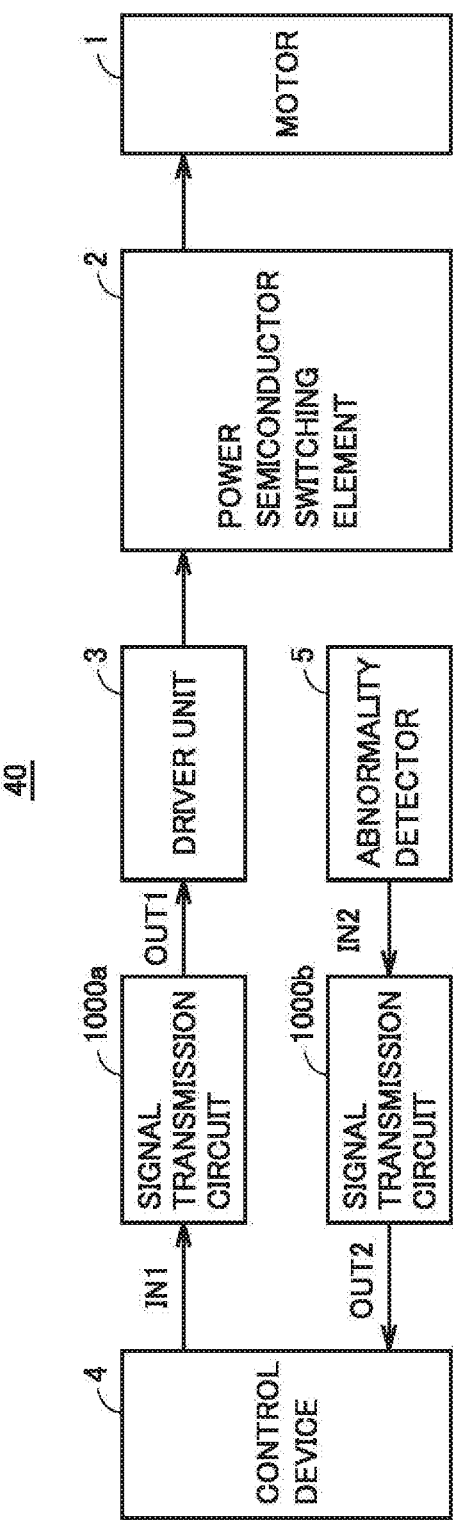
FIG. 14 is a diagram showing a configuration of a power conversion device 40 according to a seventh embodiment.

FIG. 14 is a diagram showing a configuration of a power conversion device 40 according to a seventh embodiment.

Power conversion device 40 controls motor 1 included in a hybrid vehicle or an electric vehicle.

Power conversion device 40 includes at least one power semiconductor switching element 2, driver unit 3, control device 4 which generates a control signal for controlling power semiconductor switching element 2, a signal transmission circuit 1000a which transmits a control signal from control device 4 to driver unit 3, an abnormality detector 5, and a signal transmission circuit 1000b (a second signal transmission circuit) which transmits an abnormality signal indicating an abnormal condition detected by abnormality detector 5 to control device 4. For example, signal transmission circuit 1000 according to the first embodiment is adopted as signal transmission circuit 1000a and signal transmission circuit 1000b, however, signal transmission circuits 2000 to 4000 according to the second to fifth embodiments may be adopted.

Abnormality detector 5 outputs an abnormality detection signal indicating an abnormal condition when it detects a short-circuiting state and a temperature state of power semiconductor switching element 2 or lowering in voltage of a control power supply of driver unit 3 for protection against short-circuiting and overheating of power semiconductor switching element 2 and protection against lowering in voltage of the control power supply of driver unit 3.

Signal transmission circuit 1000a is connected between control device 4 and driver unit 3. Signal transmission circuit 1000a isolates a device controlled at a high voltage such as driver unit 3, power semiconductor switching element 2, motor 1, and abnormality detector 5 from control device 4. Signal transmission circuit 1000a receives a control signal from control device 4 as an input signal IN1 and outputs the input signal as an output signal OUT1.

Signal transmission circuit 1000b is connected between control device 4 and abnormality detector 5. Signal transmission circuit 1000b isolates a device controlled at a high voltage such as driver unit 3, power semiconductor switching element 2, motor 1, and abnormality detector 5 from control device 4. Signal transmission circuit 1000b receives an abnormality detection signal output from abnormality detector 5 as an input signal IN2 and outputs the input signal as an output signal OUT2.

In this embodiment, even when a large potential difference at the time when power semiconductor switching element 2 is driven is produced between control device 4 and isolated driver unit 3 in power conversion device 40, a control signal which is the first signal from control device 4 can accurately be reflected and output as the second signal to driver unit 3. Thus, power conversion device 40 highly reliable in transmission of a control signal can be provided.

Even when a large potential difference at the time when power semiconductor switching element 2 is driven is produced between control device 4 and the isolated abnormality detector in power conversion device 40, a signal indicating detection of lowering in power supply voltage caused in driver unit 3 or power semiconductor switching element 2 or an abnormal operation such as an overcurrent and an excessive temperature can accurately be reflected, and power conversion device 40 high in reliability in transmission of an abnormality signal can be provided.

First Modification of Seventh Embodiment

Figure 15:
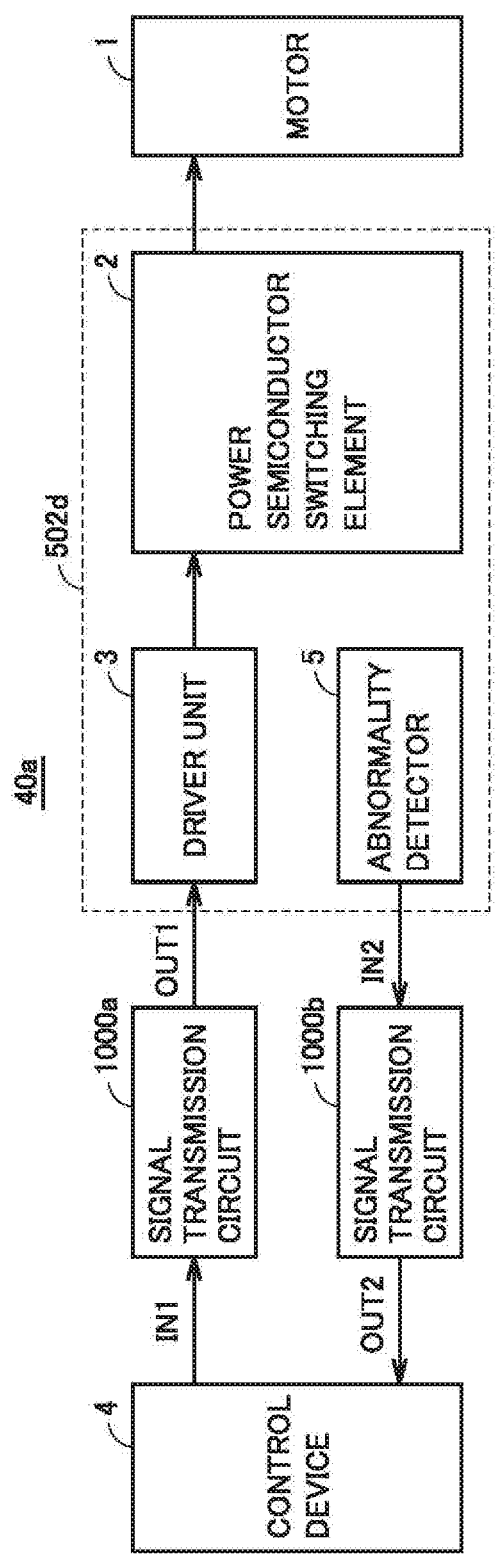
FIG. 15 is a diagram showing a configuration of a power conversion device 40a in a first modification of the seventh embodiment.

FIG. 15 is a diagram showing a configuration of a power conversion device 40a in a first modification of the seventh embodiment.

As shown in FIG. 15, power conversion device 40a is configured as in the seventh embodiment, however, power semiconductor switching element 2, driver unit 3, and abnormality detector 5 are sealed and integrally formed to implement a power module 502d as one unit.

In the present modification, an effect the same as in the seventh embodiment is obtained and isolation of power semiconductor switching element 2, driver unit 3, and abnormality detector 5 can be enhanced.

Second Modification of Seventh Embodiment

Figure 16:
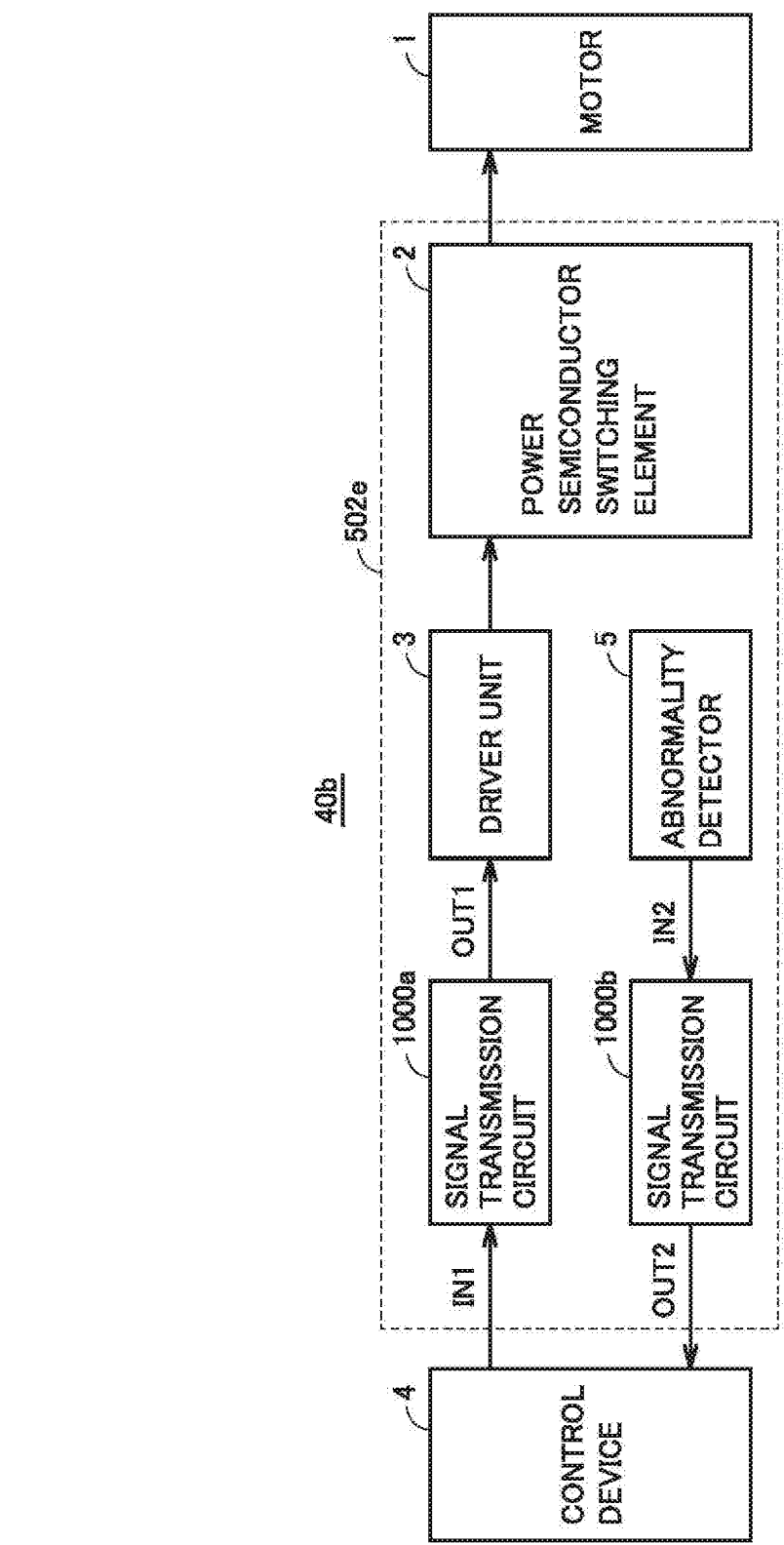
FIG. 16 is a diagram showing a configuration of a power conversion device 40b in a second modification of the seventh embodiment.

FIG. 16 is a diagram showing a configuration of a power conversion device 40b in a second modification of the seventh embodiment.

As shown in FIG. 16, power conversion device 40b is configured as in the seventh embodiment, however, power semiconductor switching element 2, driver unit 3, signal transmission circuit 1000a (first signal transmission circuit), abnormality detector 5, and signal transmission circuit 1000b (second signal transmission circuit) are sealed and integrally formed to implement a power module 502e as one unit.

In the present modification, an effect the same as in the seventh embodiment is obtained and isolation of power semiconductor switching element 2, driver unit 3, signal transmission circuit 1000a (first signal transmission circuit), abnormality detector 5, and signal transmission circuit 1000b (second signal transmission circuit) can be enhanced.

Third Modification of Seventh Embodiment

Figure 17:
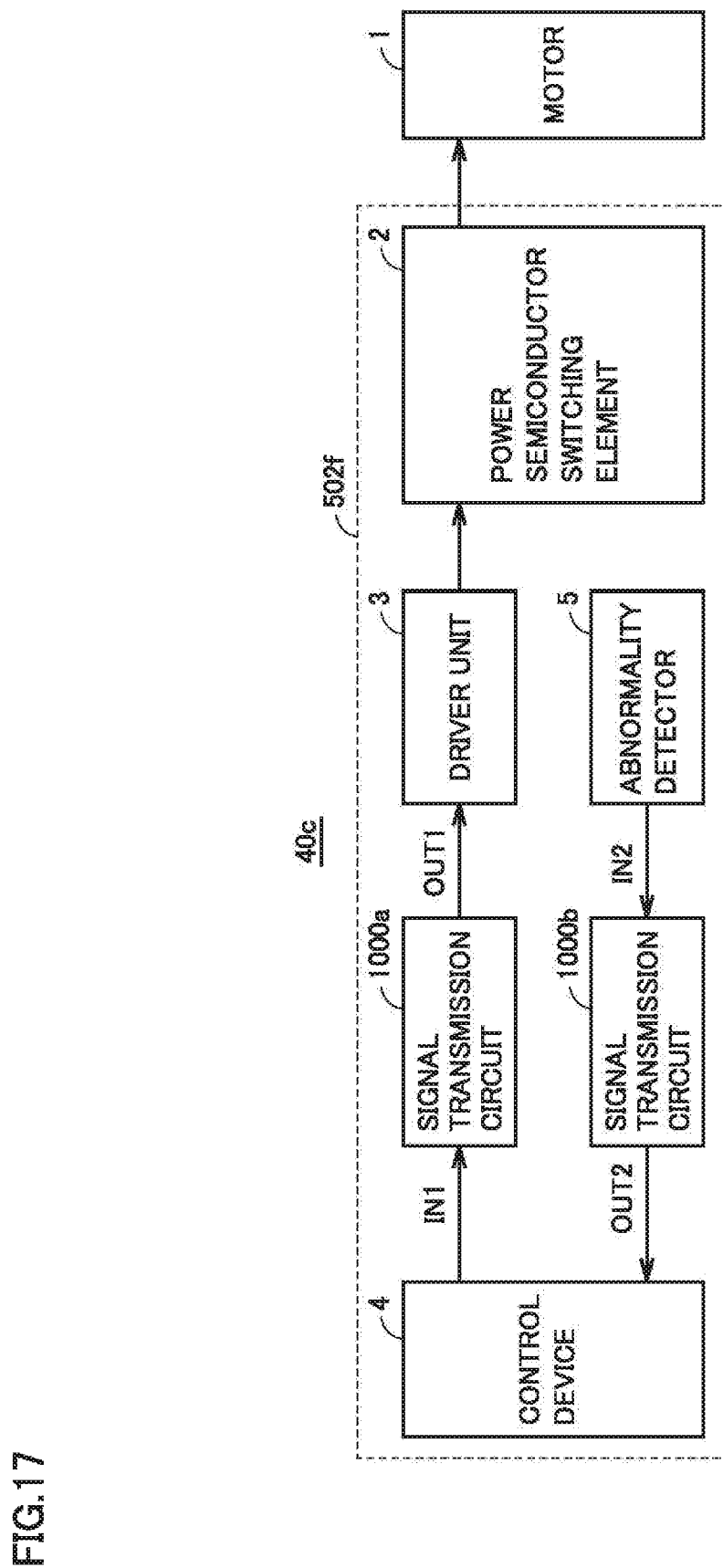
FIG. 17 is a diagram showing a configuration of a power conversion device 40c in a third modification of the seventh embodiment.

FIG. 17 is a diagram showing a configuration of a power conversion device 40c in a third modification of the seventh embodiment.

As shown in FIG. 17, power conversion device 40c is configured as in the seventh embodiment, however, power semiconductor switching element 2, driver unit 3, signal transmission circuit 1000a (first signal transmission circuit), abnormality detector 5, signal transmission circuit 1000b (second signal transmission circuit), and control device 4 are sealed and integrally formed to implement a power module 502f as one unit.

In the present modification, an effect the same as in the seventh embodiment is obtained and isolation of power semiconductor switching element 2, driver unit 3, signal transmission circuit 1000a (first signal transmission circuit), abnormality detector 5, signal transmission circuit 1000b (second signal transmission circuit), and control device 4 can be enhanced.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

The present invention is susceptible to free combination of the embodiments within the scope of the invention, and each embodiment can be modified or omitted as appropriate.

REFERENCE SIGNS LIST

1 motor; 2, 2a, 2b power semiconductor switching element; 502a to 502f power module; 3, 3a, 3b driver unit; 4 control device; 5 abnormality detector; 7 AC output terminal; 10, 10a, 10b transformer; 11, 11X first coil; 12, 12X second coil; 11Y third coil; 12Y fourth coil; 30, 30a, 30b, 30c, 40, 40a, 40b, 40c power conversion device; 100, 100a, 100b, 120 first circuit; 101, 101a input terminal; 110, 110a, 111 first pulse conversion circuit; 200, 200a, 200b, 203, 285 second circuit; 201, 201a output terminal; 210, 210a, 210X, 210Y control circuit; 240, 240a, 240X, 240Y first rectifier circuit; 250, 250a, 250X, 250Y second rectifier circuit; 241, 242, 251, 252, 241a, 242a, 251a, 252a, 241X, 242X, 251X, 252X, 241Y, 242Y, 251Y, 252Y diode; 220, 230, 220X, 230X, 220Y, 230Y output resistor of control circuit; 260, 260a, 260X, 260Y detection circuit; 270 first constant current circuit; 280 second constant current circuit; 271, 272, 281, 282 constant current source; 290 latch circuit; 1000, 1000a, 1000b, 2000, 3000, 4000 signal transmission circuit

The invention claimed is:

1. A signal transmission circuit comprising:
a transformer having a first coil and a second coil;
a first circuit connected to the first coil and configured to generate and output a transmission signal to a first end and a second end of the first coil in response to variation in logical value of an input first signal; and
a second circuit connected to the second coil and configured to generate and output a second signal which reflects the first signal input to the first circuit,
the second circuit including
a detection circuit having two input terminals connected to a first end and a second end of the second coil, respectively, and configured to detect a voltage signal generated at each of the first end and the second end of the second coil and output the second signal based on a result of detection,
a first rectifier circuit including a first diode and a second diode connected in a forward direction and in a reverse direction, respectively, to the first end of the second coil,
a second rectifier circuit including a third diode and a fourth diode connected in the forward direction and in the reverse direction, respectively, to the second end of the second coil,
a control circuit which generates a first control voltage directly applied to opposing ends of each of the first diode and the second diode of the first rectifier circuit, and a second control voltage directly applied to opposing ends of each of the third diode and the fourth diode of the second rectifier circuit to control currents through the first diode, the second diode, the third diode, and the fourth diode, the control circuit outputting a bias voltage applied to the first and second ends of the second coil via a first resistor and a second resistor, and the first rectifier circuit suppresses an amount of variation in a voltage at the first end of the second coil, the second rectifier circuit suppresses an amount of variation in a voltage at the second end of the second coil, and the control circuit controls the amount of the variation in the voltage at the first end of the second coil and the amount of the variation in the voltage at the second end of the second coil.

2. The signal transmission circuit according to claim 1, wherein
the transmission signal to the first end and the second end of the first coil includes a single pulse alternately generated once for each change in logical value of the first signal or a plurality of successively generated pulses.

3. A power conversion device comprising:
a power semiconductor switching element;
a driver unit which drives the power semiconductor switching element;
a control device which generates a control signal for controlling the power semiconductor switching element; and
the signal transmission circuit according to claim 1,
the signal transmission circuit being provided between the control device and the driver unit to isolate the control device and the driver unit from each other,
the signal transmission circuit being configured to receive the control signal from the control device as the first signal and output the second signal as an output signal to the driver unit.

4. A power conversion device comprising:
a power semiconductor switching element;
a driver unit which drives the power semiconductor switching element;
a control device which generates a control signal for controlling the power semiconductor switching element;
an abnormality detector which detects an abnormal condition of the power semiconductor switching element;
a first signal transmission circuit implemented by the signal transmission circuit according to claim 1; and
a second signal transmission circuit implemented by the signal transmission circuit according to claim 1,
the first signal transmission circuit being provided between the control device and the driver unit to isolate the control device and the driver unit from each other,
the first signal transmission circuit being configured to receive the control signal from the control device and output the control signal as an first output signal to the driver unit,
the second signal transmission circuit being connected between the control device and the abnormality detector to isolate the control device and the abnormality detector from each other, and
the second signal transmission circuit being configured to receive an abnormality detection signal output from the abnormality detector and output the abnormality detection signal as second output signal to the control device.

5. The signal transmission circuit according to claim 1, wherein the first voltage directly applied to the opposing ends of each of the first diode and second diode of the first rectifier circuit is applied to a first end and a second end of each of the first diode and the second diode of the first rectified circuit, the first end of each of the first diode and the second diode being at the first end of the second coil and the second end of each of the first diode and the second diode being at E-side-e the second end of the second coil, and the second voltage directly applied to the opposing ends of each of the third diode and fourth diode of the second rectifier circuit is applied to a first end and a second end of each of the third diode and the fourth diode of the second rectifier circuit, the first end of each of the third diode and the fourth diode being at the first end of the second coil and the second end of each of the third diode and the fourth diode being at the second end of the second coil, to control current through the first diode, the second diode, the third diode, and the fourth diode.

6. The signal transmission circuit according to claim 1, wherein the detection circuit is further configured to:
compare the voltage signal generated at the first end of the second coil and the voltage signal generated at the second end of the second coil, and
generate the second signal based on a result of the comparison.

7. The signal transmission circuit according to claim 1, wherein the variation in the logical value of the input first signal is a first transition from low to high or a second transition from high to low.

8. The signal transmission circuit according to claim wherein the variation in the logical value of the input first signal is either the first transition from low to high or the second transition from high to low.

9. The signal transmission circuit according to claim 1, wherein
the first diode has a cathode connected to the first end of the second coil and has an anode configured to receive the first control voltage of the control circuit,
the second diode has an anode connected to the first end of the second coil and has a cathode configured to receive the second control voltage of the control circuit,
the third diode has a cathode connected to the second end of the second coil and has an anode configured to receive the first control voltage of the control circuit,
the fourth diode has an anode connected to the second end of the second coil and has a cathode configured to receive the second control voltage of the control circuit,
the cathode of the first diode, the anode of the second diode, the cathode of the third diode, and the anode of the fourth diode receive the bias voltage through the first resistor and the second resistor,
the first diode suppresses an amount of variation when a voltage at the first end of the second coil is varied in a decreasing direction due to a potential difference produced between the first coil and the second coil of the transformer,
the second diode suppresses an amount of variation when the voltage at the first end of the second coil is varied in an increasing direction due to the potential difference produced between the first coil and the second coil of the transformer,
the third diode suppresses an amount of variation when the voltage at the second end of the second coil is varied in a decreasing direction due to the potential difference produced between the first coil and the second coil of the transformer, and
the fourth diode suppresses an amount of variation when the voltage at the second end of the second coil is varied in an increasing direction due to the potential difference produced between the first coil and the second coil of the transformer.

10. The signal transmission circuit according to claim 9, wherein
the control circuit controls the amount of variation in the voltage at the first end of the second coil in the decreasing direction and the amount of variation in the voltage at the second end of the second coil in the decreasing direction by setting the first control voltage and the bias voltage to be equal in magnitude to each other.

11. The signal transmission circuit according to claim 9, wherein
the control circuit controls the amount of variation in the voltage at the first end of the second coil in the decreasing direction and the amount of variation in the voltage at the second end of the second coil in the decreasing direction by setting the first control voltage to be smaller in magnitude than the bias voltage.

12. The signal transmission circuit according to claim 9, wherein
the control circuit controls the amount of variation in the voltage at the first end of the second coil in the decreasing direction and the amount of variation in the voltage at the second end of the second coil in the decreasing direction by setting the first control voltage to be greater in magnitude than the bias voltage.

13. The signal transmission circuit according to claim 9, wherein
the control circuit controls the amount of variation in the voltage at the first end of the second coil in the increasing direction and the amount of variation in the voltage at the second end of the second coil in the increasing direction by setting the second control voltage and the bias voltage to be equal in magnitude to each other.

14. The signal transmission circuit according to claim 9, wherein
the control circuit controls the amount of variation in the voltage at the first end of the second coil in the increasing direction and the amount of variation in the voltage at the second end of the second coil in the increasing direction by setting the second control voltage to be smaller in magnitude than the bias voltage.

15. The signal transmission circuit according to claim 9, wherein
the control circuit controls the amount of variation in the voltage at the first end of the second coil in the increasing direction and the amount of variation in the voltage at the second end of the second coil in the increasing direction by setting the second control voltage to be greater in magnitude than the bias voltage.

16. The signal transmission circuit according to claim 9, wherein
the second circuit includes a first constant current circuit connected to the first end of the second coil and a second constant current circuit connected to the second end of the second coil,
the first constant current circuit includes a first constant current source which supplies a first current to the first end of the second coil,
the second constant current circuit includes a second constant current source which supplies a second current to the second end of the second coil,
after the amount of variation in the voltage at the first end of the second coil in the decreasing direction due to a potential difference produced between the first coil and the second coil of the transformer is suppressed by the first diode, the first constant current source shortens a first time period until the voltage at the first end of the second coil returns to a steady state by supplying the first current to the first end of the second coil, and
after the amount of variation in voltage at the second end of the second coil in the decreasing direction due to the potential difference produced between the first coil and the second coil of the transformer is suppressed by the third diode, the second constant current source shortens a second time period until the voltage at the second end of the second coil returns to a steady state by supplying the second current to the second end of the second coil.

17. The signal transmission circuit according to claim 9, wherein
the second circuit includes a first constant current circuit connected to the first end of the second coil and a second constant current circuit connected to the second end of the second coil,
the first constant current circuit includes a third constant current source which draws out a first current from the first end of the second coil,
the second constant current circuit includes a fourth constant current source which draws out a second current from the second end of the second coil,
after the amount of variation in voltage at the first end of the second coil in the increasing direction due to a potential difference produced between the first coil and the second coil of the transformer is suppressed by the second diode, the third constant current source shortens a first time period until the voltage at the first end of the second coil returns to a steady state by drawing out the first current from the first end of the second coil, and
after the amount of variation in voltage at the second end of the second coil in the increasing direction due to the potential difference produced between the first coil and the second coil of the transformer is suppressed by the fourth diode, the fourth constant current source shortens a second time period until the voltage at the second end of the second coil returns to a steady state by drawing out the second current from the second end of the second coil.

18. A signal transmission circuit comprising:
a transformer having a first coil and a second coil;
a first circuit connected to the first coil and configured to generate and output a transmission signal to a first end and a second end of the first coil in response to variation in logical value of an input first signal; and
a second circuit connected to the second coil and configured to generate and output a second signal which reflects the first signal input to the first circuit,
the second circuit including
a detection circuit having two input terminals connected to a first end and a second end of the second coil, respectively, and configured to detect a voltage signal generated at each of the first end and the second end of the second coil and output the second signal based on a result of detection,
a first rectifier circuit including a first diode and a second diode connected in a forward direction and in a reverse direction, respectively, to the first end of the second coil, and
a control circuit which generates a voltage directly applied to opposing ends of each of the first diode and the second diode of the first rectifier circuit to control currents through the first diode and the second diode, the control circuit outputting a bias voltage applied to the first end of the second coil via a resistor, the second coil having the second end connected to a reference power supply, and the first rectifier circuit suppresses an amount of variation in a voltage at the first end of the second coil, a second rectifier circuit suppresses an amount of variation in a voltage at the second end of the second coil, and the control circuit controls the amount of the variation in the voltage at the first end of the second coil and the amount of the variation in the voltage at the second end of the second coil.

19. A signal transmission circuit comprising:

a first transformer having a first coil and a second coil;

a second transformer having a third coil and a fourth coil;

a first circuit connected to the first coil and the third coil and configured to generate and output a first transmission signal to a first end and a second end of the first coil in response to rise of an input first signal and to generate and output a second transmission signal to a first end and a second end of the third coil in response to fall of the input first signal; and a second circuit connected to the second coil and the fourth coil and configured to generate and output a second signal which reflects the first signal input to the first circuit, the second circuit including a first detection circuit having two input terminals connected to a first end and a second end of the second coil, respectively, and configured to detect a voltage signal generated at each of the first end and the second end of the second coil and output a set signal based on a result of detection, a second detection circuit having two input terminals connected to a first end and a second end of the fourth coil, respectively, and configured to detect a voltage signal generated at each of the first end and the second end of the fourth coil and output a reset signal based on a result of detection, a latch circuit having a set terminal configured to receive the set signal from the first detection circuit and a reset terminal configured to receive the reset signal from the second detection circuit and output the second signal which reflects the first signal input to the first circuit, a first rectifier circuit including a first diode and a second diode connected in a forward direction and in a reverse direction, respectively, to the first end of the second coil, a second rectifier circuit including a third diode and a fourth diode connected in the forward direction and in the reverse direction, respectively, to the second end of the second coil, a third rectifier circuit including a fifth diode and a sixth diode connected in the forward direction and in the reverse direction, respectively, to the first end of the fourth coil, a fourth rectifier circuit including a seventh diode and an eighth diode connected in the forward direction and in the reverse direction, respectively, to the second end of the fourth coil, a first control circuit which controls a voltage to be applied to opposing ends of each of the first diode and the second diode of the first rectifier circuit and a voltage to be applied to opposing ends of each of the third diode and the fourth diode of the second rectifier circuit, the first control circuit outputting a first bias voltage to be applied to the first and second ends of the second coil via a first resistor and a second resistor, a second control circuit which controls a voltage to be applied to opposing ends of each of the fifth diode and the sixth diode of the third rectifier circuit and a voltage to be applied to opposing ends of each of the seventh diode and the eighth diode of the fourth rectifier circuit, the second control circuit outputting a second bias voltage to be applied to the first and second ends of the fourth coil via a third resistor and a fourth resistor, and the first rectifier circuit suppresses an amount of variation in a voltage at the first end of the second coil, the second rectifier circuit suppresses an amount of variation in a voltage at the second end of the second coil, and the control circuit controls the amount of the variation in the voltage at the first end of the second coil and the amount of the variation in the voltage at the second end of the second coil.

* * * * *